(12) United States Patent
Hossain et al.

(10) Patent No.: US 8,436,289 B1
(45) Date of Patent: May 7, 2013

(54) SYSTEM AND METHOD FOR DETECTING PARTICLES WITH A SEMICONDUCTOR DEVICE

(75) Inventors: Timothy Z. Hossain, Austin, TX (US); Patrick Mark Clopton, Austin, TX (US); Christopher Michael Foster, Austin, TX (US); Christopher F. Lyons, Fremont, CA (US); Clayton Fullwood, Austin, TX (US); Greg Alan Goodwin, Austin, TX (US); Dan E. Posey, Granite Shoals, TX (US)

(73) Assignee: Spansion LLC, Sunnyvale, CA (US)

( * ) Notice: Subject to any disclaimer, the term of this patent is extended or adjusted under 35 U.S.C. 154(b) by 286 days.

(21) Appl. No.: 12/844,888

(22) Filed: Jul. 28, 2010

Related U.S. Application Data

(63) Continuation-in-part of application No. 12/472,735, filed on May 27, 2009, now Pat. No. 8,232, 515.

(60) Provisional application No. 61/300,723, filed on Feb. 2, 2010, provisional application No. 60/060,001, filed on Jun. 9, 2008.

(51) Int. Cl.
*H01L 31/00* (2006.01)
(52) U.S. Cl.
USPC .................................. 250/214.1; 250/370.05
(58) Field of Classification Search ................ 250/208.1, 250/214.1, 214 R, 238, 239, 207, 214 VT, 250/370.09–370.14, 338.1–338.4; 378/98.11, 378/98.12
See application file for complete search history.

(56) References Cited

U.S. PATENT DOCUMENTS

| | | | |
|---|---|---|---|
| 4,897,550 A | 1/1990 | Bernard et al. | |
| 5,019,886 A | 5/1991 | Sato et al. | |
| 6,075,261 A | 6/2000 | Hossain et al. | |
| 6,194,727 B1 | 2/2001 | Lee et al. | |
| 7,109,859 B2 | 9/2006 | Peeters | |
| 7,271,389 B2 * | 9/2007 | August et al. | 250/370.05 |
| 7,645,993 B2 * | 1/2010 | Gazda et al. | 250/370.05 |
| 7,902,520 B2 * | 3/2011 | Hossain et al. | 250/395 |
| 8,232,515 B2 | 7/2012 | Hossain et al. | |
| 2010/0155611 A1 * | 6/2010 | Fullwood et al. | 250/370.05 |
| 2010/0294946 A1 | 11/2010 | McCarthy | |

OTHER PUBLICATIONS

Hossain, Tim et al. Neutron Intercepting Semiconductor Chip (NISC), BAA Proposal.

* cited by examiner

*Primary Examiner* — Francis M Legasse, Jr.
(74) *Attorney, Agent, or Firm* — Sterne, Kessler, Goldstein & Fox P.L.L.C.

(57) ABSTRACT

Systems and methods are described herein for detecting particles emitted by nuclear material. The systems comprise one or more semiconductor devices for detecting particles emitted from nuclear material. The semiconductor devices can comprise a charge storage element comprising several layers. A non-conductive charge storage layer enveloped on top and bottom by dielectric layers is mounted on a substrate. At least one top semiconductor layer can be placed on top of the top dielectric layer. A reactive material that reacts to particles, such as neutrons emitted from nuclear material, can be incorporated into the top semiconductor layer. When the reactive material reacts to a particle emitted from nuclear material, ions are generated that can alter the charge storage layer and enable detection of the particle.

15 Claims, 23 Drawing Sheets

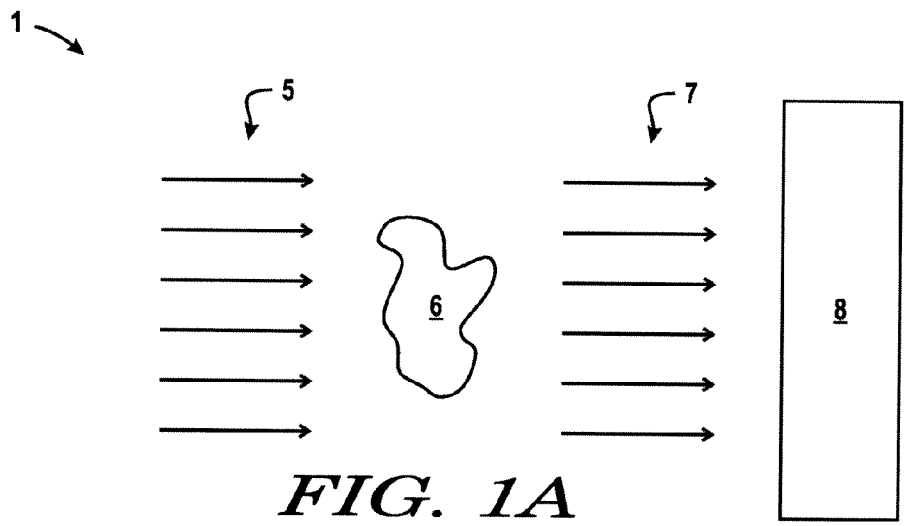
FIG. 1A
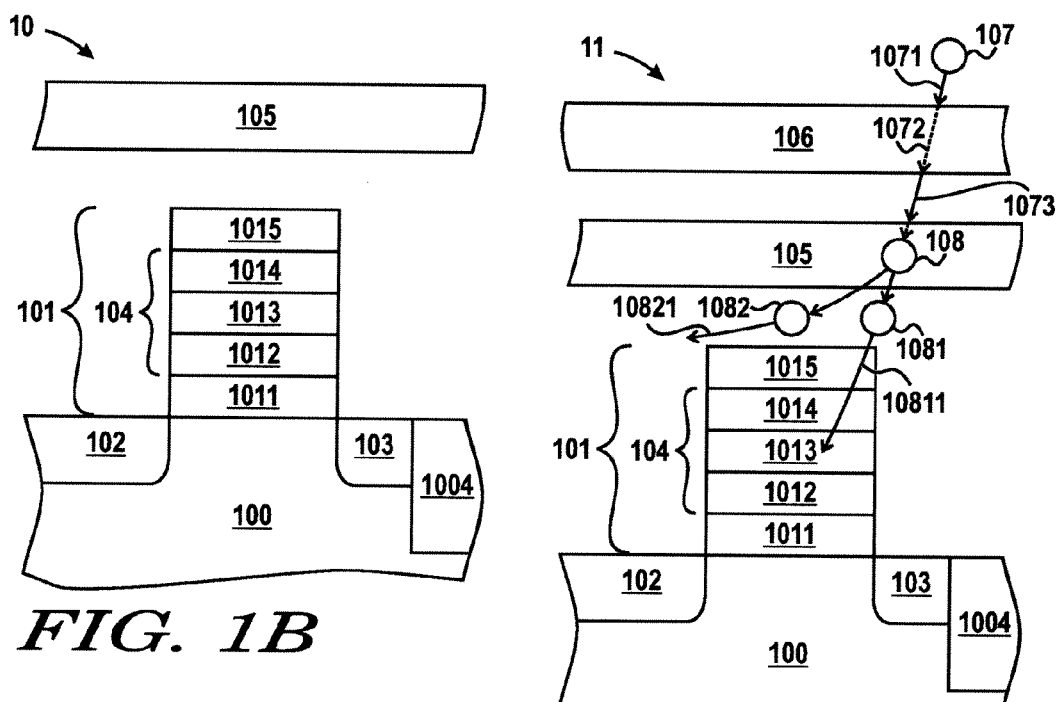
FIG. 1B
FIG. 2

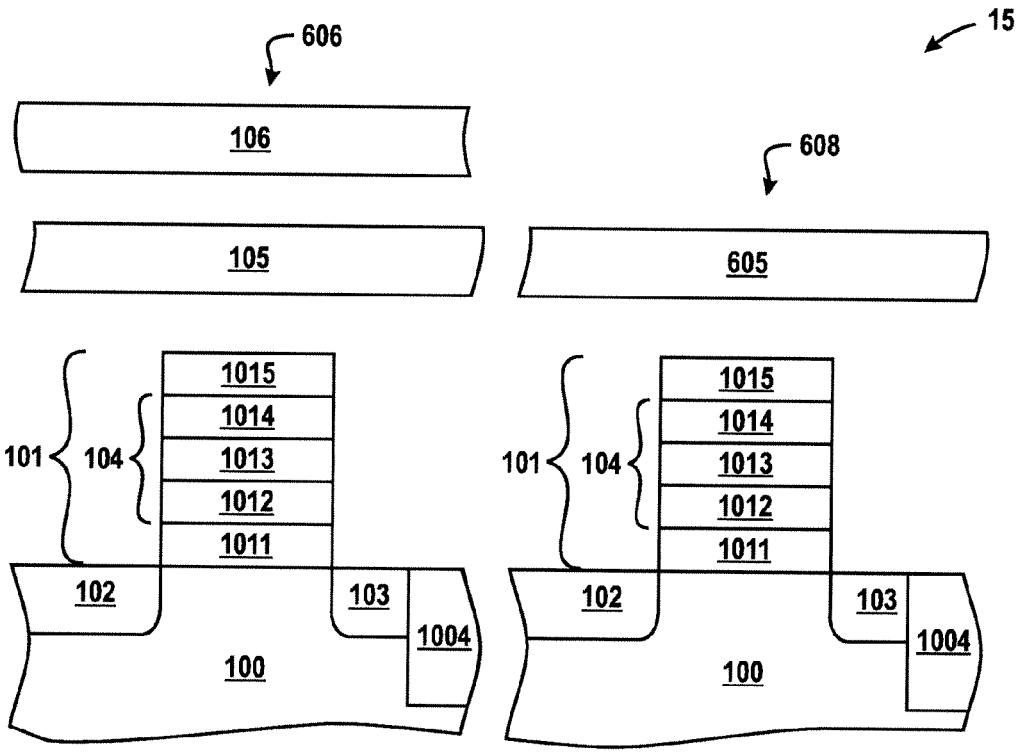
FIG. 6
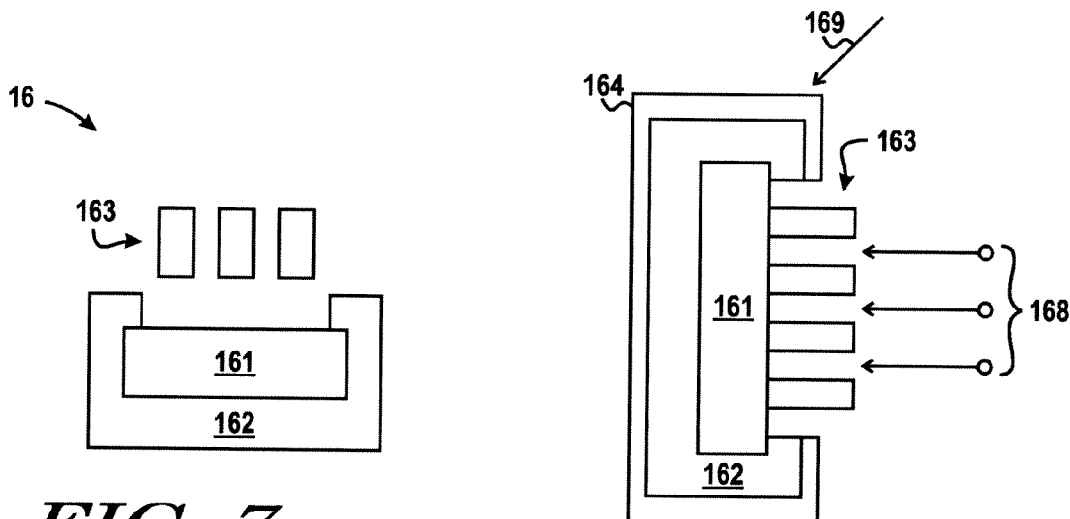
FIG. 7
FIG. 8

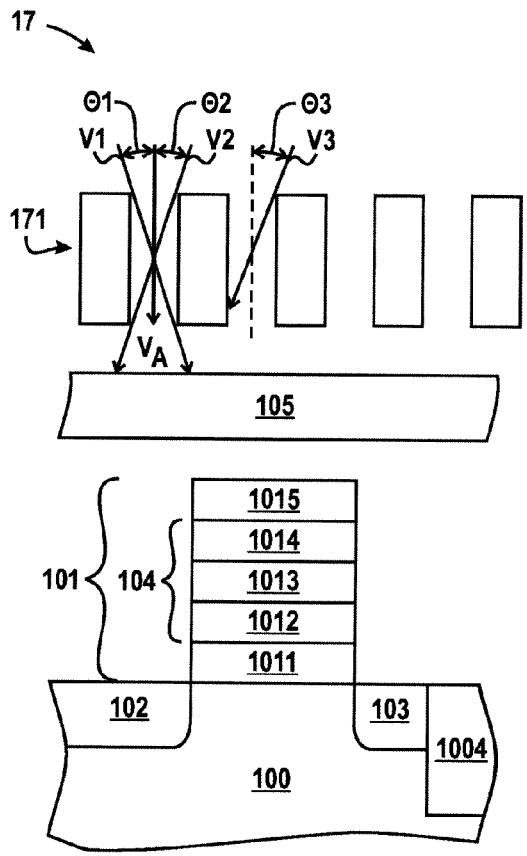
FIG. 9
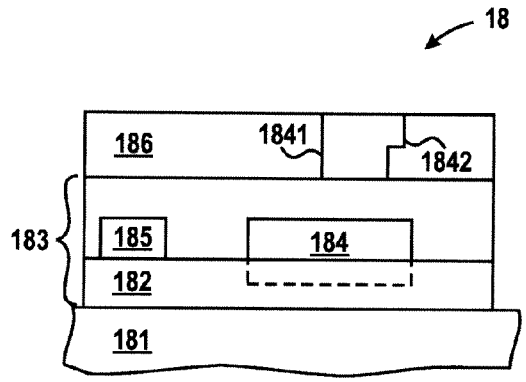
FIG. 10
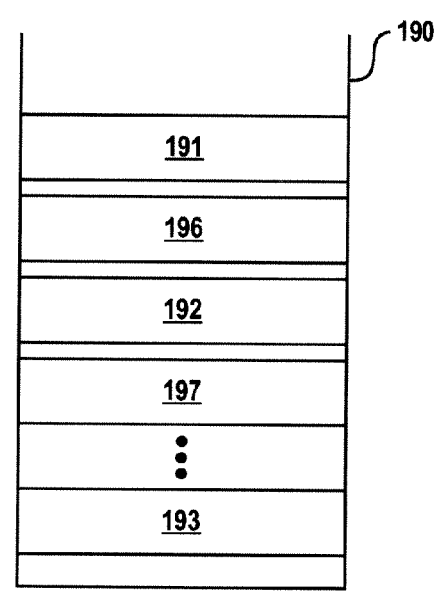
FIG. 11
FIG. 12

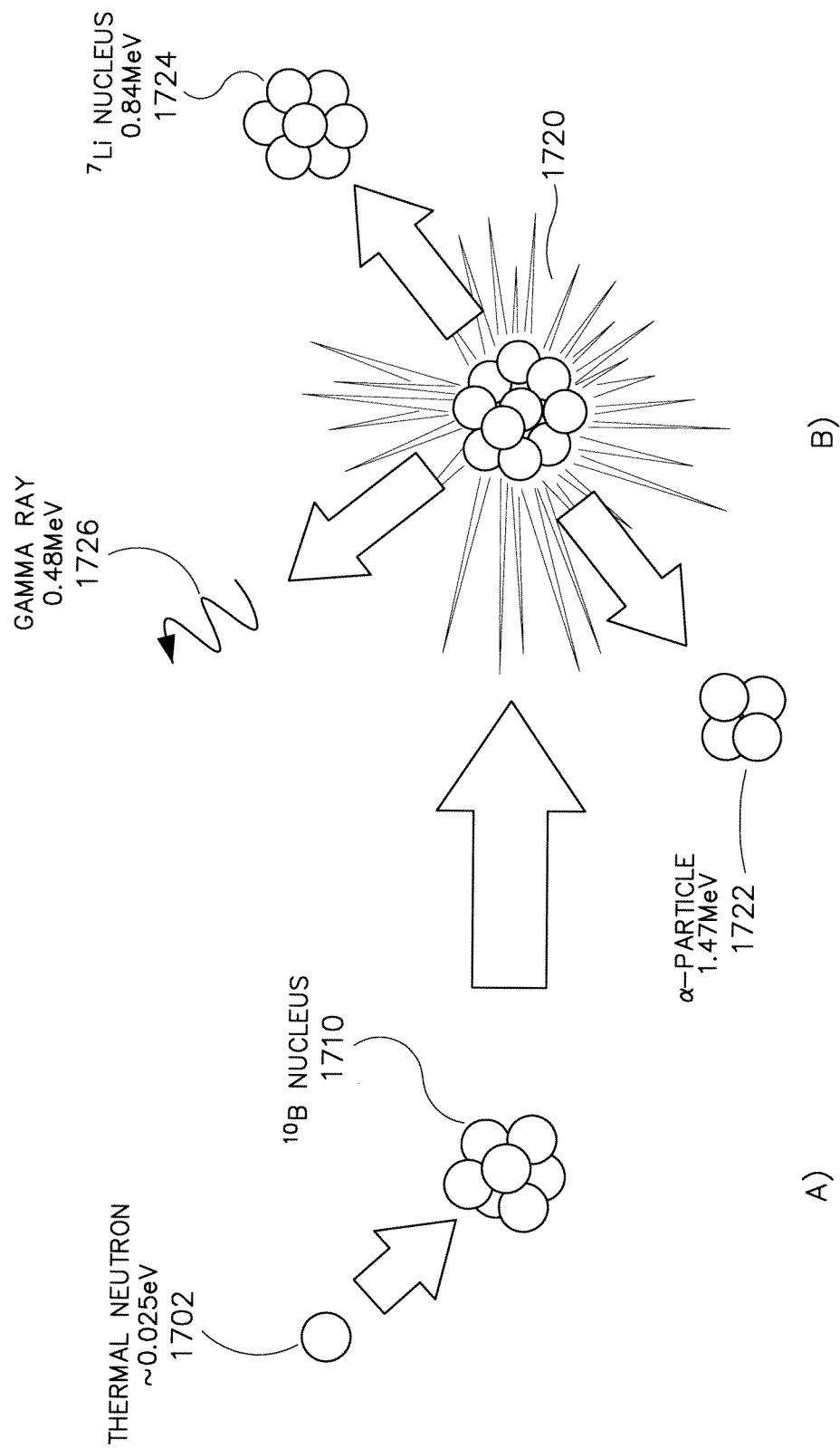

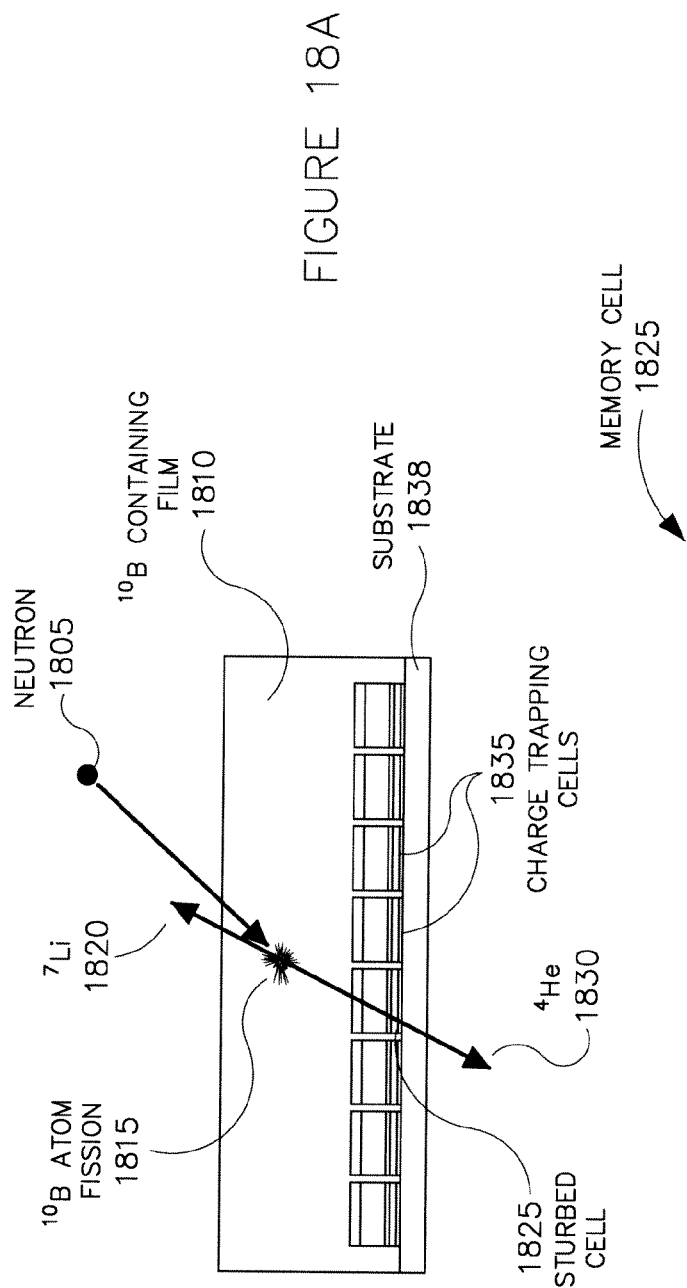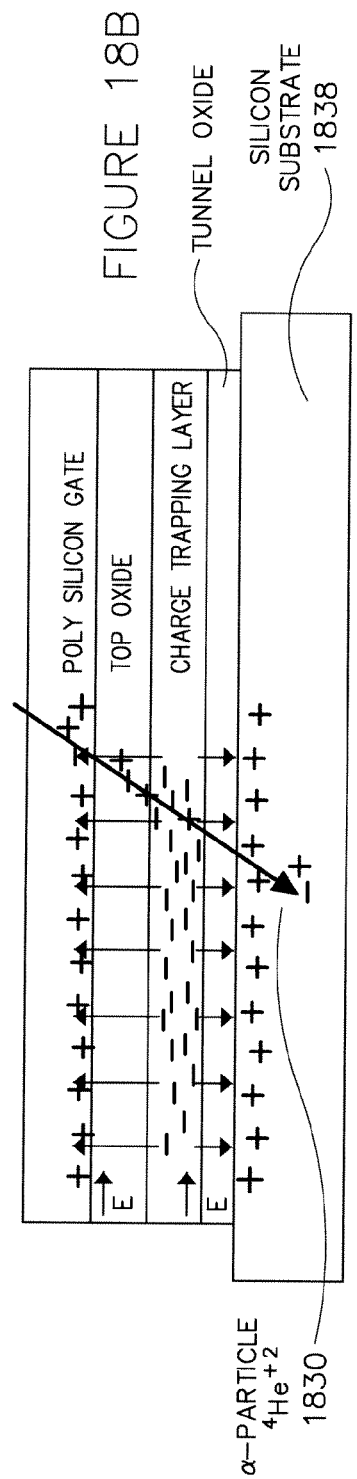

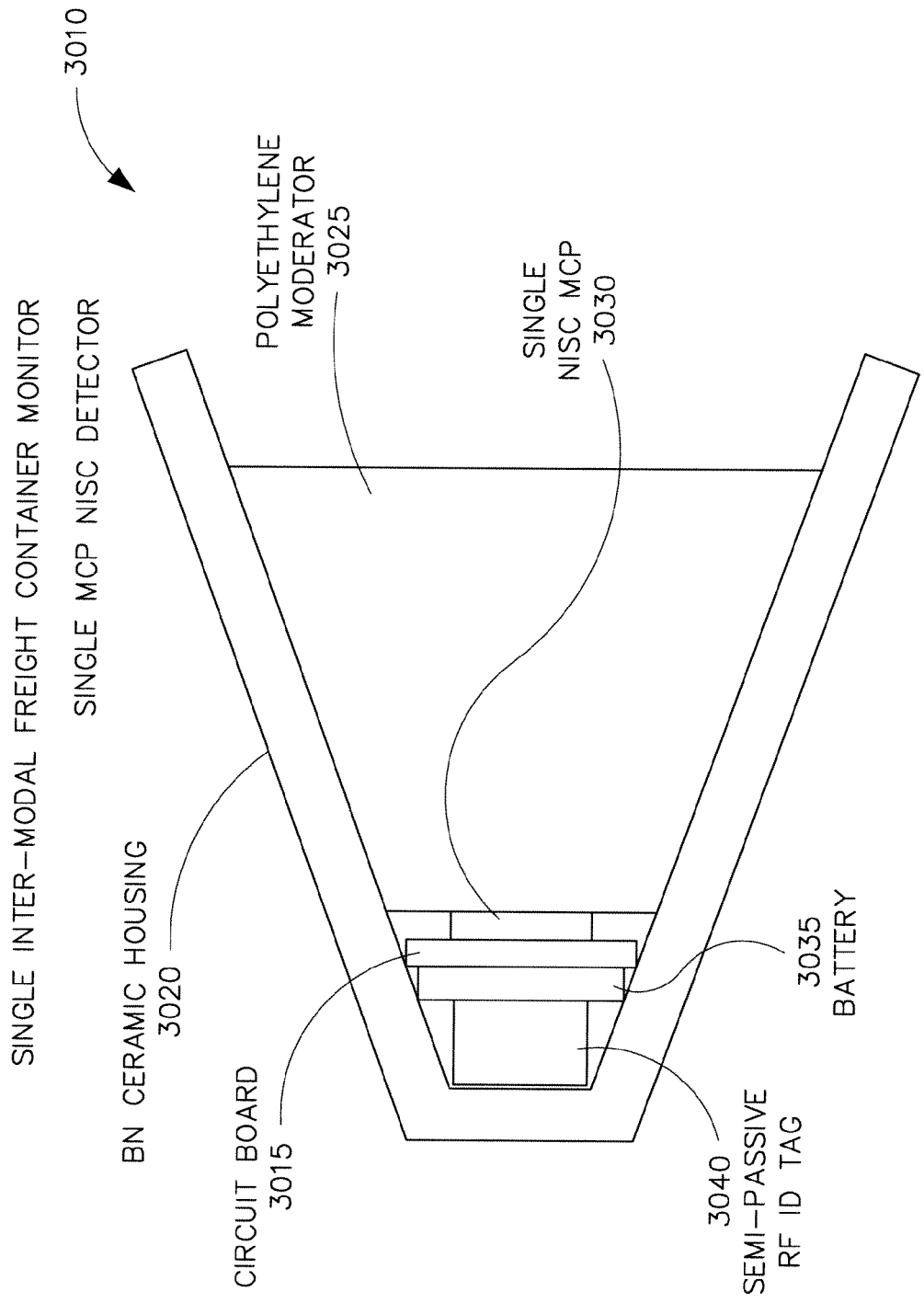

EXEMPLARY 10x10x2 PORTAL ARRAY DETECTOR 3120

POLYETHYLENE MODERATOR 3150
BORON NITRIDE CERAMIC HOUSING 3145
BERYLLIUM BACK REFLECTOR 3130
3140 10x10x2 NISC ARRAY

3110 SINGLE NISC MCP

SYSTEM AND METHOD FOR DETECTING PARTICLES WITH A SEMICONDUCTOR DEVICE

CROSS-REFERENCE TO RELATED APPLICATIONS

The present application claims priority to and is a continuation-in-part application of U.S. patent application Ser. No. 12/472,735, filed May 27, 2009, now U.S. Pat. No. 8,232,515, which claims priority to U.S. Provisional Patent Application Ser. No. 61/060,001, filed Jun. 9, 2008. The present application also claims priority to U.S. Provisional Patent Application Ser. No. 61/300,723, filed Feb. 2, 2010. The present application incorporates by reference in their entirety each of the foregoing applications.

BACKGROUND

1. Field of the Invention

The present invention relates generally to detectors for detecting particles emitted from radioactive materials. More specifically, the present invention relates to using semiconductor devices as detectors for detecting particles emitted from radioactive materials.

2. Description of Related Art

Conventional Neutron Detectors

Conventional neutron detectors generally include a sealed vessel containing a neutron sensitive gas, such as $^3$He or BF3 at 2-4 ATM, and an electrically charged wire having leads that extend outside of the vessel. In operation, incident neutrons react with the gas to produce charged particles that change the electrical state of the wire. A measurement system, coupled to the charged wire, measures the electrical pulses and uses this information to indicate the presence of neutrons.

Conventional neutron detectors suffer from a variety of drawbacks including: having a bulky size, having poor sensitivity resulting from electrical noise or other interference, requiring external equipment and power supplies, and being difficult to manufacture.

Attempts have been made to produce more portable neutron detectors using semiconductors. For example, in U.S. Pat. No. 5,019,886, entitled "Semiconductor-Based Radiation Detector Element", $^3$He is diffused into a semiconductor substrate. This particular detector is associated with a number of drawbacks, including e.g., high cost and difficult manufacturing.

Attempts have also been made to manufacture a diode neutron detector. However, the diodes continue to suffer from a variety of limitations including: sensitivity to gamma rays, requiring external components and power supplies, complex manufacturing, and low efficiency. These limitations hamper the effectiveness and ease of implementing diode detectors.

SUMMARY OF THE INVENTION

The present invention addresses the foregoing limitations in the existing art by providing a device that stores charge in a non-conductive layer. The charge stored in the non-conductive layer provides a more sensitive detector device that produces fewer false positives and provides more accurate detection.

In a first exemplary embodiment, a device for detecting neutrons comprises a charge storage structure where the charge storage structure comprises multiple layers. A first layer of the charge storage structure comprises boron-10 which reacts with a neutron producing an alpha particle and a lithium ion. A second layer of the charge storage structure comprises silicon. Third and fifth layers of the charge storage structure comprise a dielectric material. Between the third and fifth layers is a fourth layer comprising a non-conductive material and a plurality of electrons giving the fourth layer a net negative charge. Lastly, a sixth layer is located below the fifth layer and can serve as a substrate for the charge storage structure.

In a second exemplary embodiment, a device for detecting a particle emitted from radioactive material comprises a charge storage structure where the charge storage structure comprises multiple layers. A first layer comprises reactive material that reacts to the particle and produces at least one ion. A second layer of the charge storage structure comprises silicon. Third and fifth layers of the charge storage structure comprise a non-conductive material. Between the third and fifth layers is a fourth layer comprising a non-conductive material and a plurality of electrons giving the fourth layer a net negative charge. Lastly, a sixth layer is located below the fifth layer and can serve as a substrate for the charge storage structure.

In a third exemplary embodiment, a device for detecting an alpha particle comprises a charge storage structure where the charge storage structure comprises multiple layers. The first layer of the charge storage structure comprises silicon. The second and fourth layers of the charge storage structure comprise a non-conductive material. The third layer of the charge storage structure comprises a non-conductive material and a plurality of electrons giving the third layer a net negative charge. Lastly, a fifth layer of the charge storage structure is located below the fourth layer and can serve as a substrate.

These and other exemplary embodiments of the invention will be described in greater detail in the following text and in the associated figures.

BRIEF DESCRIPTION OF THE FIGURES

FIG. 1A includes a general illustration of an imaging device.

FIG. 1B includes an illustration of an imaging device in accordance with an embodiment.

FIG. 2 includes a cross-sectional illustration of a device including a radiation-detecting device in accordance with an embodiment.

FIG. 6 includes a cross-sectional illustration of a device including a radiation-detecting structure in accordance with an embodiment.

FIG. 7 includes a cross-sectional illustration of a device including a radiation-detecting device in accordance with an embodiment.

FIG. 8 includes a cross-sectional illustration of a device including a radiation-detecting device in accordance with an embodiment.

FIG. 9 includes a cross-sectional illustration of a radiation-detecting device in accordance with an embodiment.

FIG. 10 includes a cross-sectional illustration of a device including a radiation-detecting structure in accordance with an embodiment.

FIG. 11 includes an illustration of a portion of the radiation-detecting structure in accordance with an embodiment.

FIG. 12 includes a cross-sectional illustration of a device including a radiation-detecting structure in accordance with an embodiment.

FIG. 17 includes an illustration of an interaction between a neutron and a boron-10 atom in accordance with an embodiment.

FIGS. 18A, 18B, and 18C include cross-sectional illustrations of a neutron interacting with a charge storage element in accordance with an embodiment.

FIG. 30 shows a single detector device in accordance with an exemplary embodiment.

DETAILED DESCRIPTION

Figure 3:
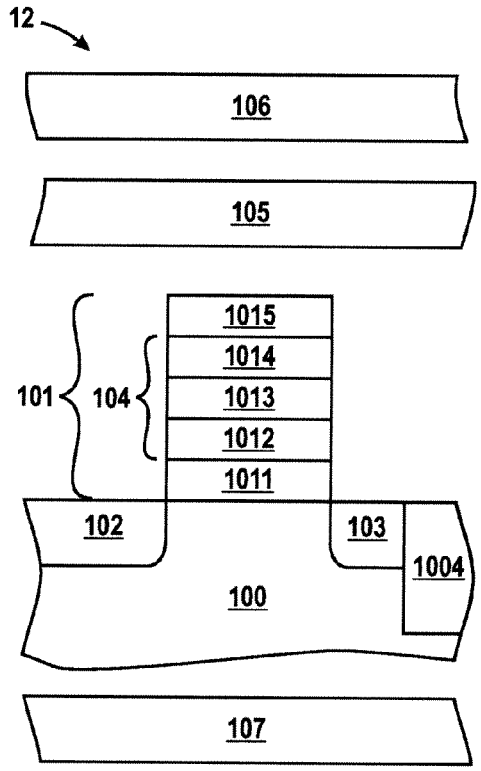
FIG. 3 includes a cross-sectional illustration of a device including a radiation-detecting structure in accordance with an embodiment.

FIG. 1A includes an illustration of an imaging device and a method of capturing of an image of an object with the imaging device in accordance with an embodiment. As illustrated, imaging particles 5 can be directed at an object 6 such that they strike the object 6. In accordance with a particular embodiment, the imaging particles may be of a variety such that they interact with the object 6 and upon interacting with the object 6, spawned imaging particles 7 are generated. After the generation of the spawned imaging particles 7, such particles 7 can interact with the imaging device 8, which in certain embodiments can incorporate components sensitive to the spawned imaging particles 7. For example, in certain embodiments, imaging particles 5 may have characteristics in which when interacting with the object 6, spawned imaging particles 7 are generated having characteristics of certain forms of radiation, and the imaging device 8 can include a radiation-detecting device. In accordance with an embodiment, the imaging device can be formed such that it includes the object 6, such that the characteristics of the spawned imaging particles 7 are more easily detectable by the imaging device 8.

FIG. 1B includes a cross-sectional illustration of a device including a radiation-detecting structure, that can be used in accordance with a specific embodiment of the disclosure to create an image. As illustrated, the device 10 includes a substrate 100, generally suitable for supporting components. According to one embodiment, the substrate 100 can include a semiconductive material. Suitable semiconductive materials include silicon, germanium, and the like. In accordance with a particular embodiment, the substrate is made of a single crystal material, such as a single crystal silicon wafer.

As further illustrated in FIG. 1B, the device 10 includes a stack 101 made of a plurality of layers overlying the substrate 100. The stack 101 can represent a structure suitable got storing charges, for example, it may be a transistor gate stack having a charge storage structure. As illustrated, the stack 101 includes a layer 1011 disposed directly overlying and abutting an upper surface of the substrate 100. In accordance with a particular embodiment, layer 1011 can include a dielectric material. Suitable dielectric materials can include oxides, nitrides, and combinations thereof. In accordance with a particular embodiment, the layer 1011 includes silicon dioxide. Layer 1011 can be formed by growth techniques, deposition techniques, and the like.

As further illustrated in FIG. 1B, the stack 101 includes a charge storage structure 104 overlying the substrate 100. Notably, the charge storage structure 104 includes a plurality of layers, particularly layers 1012, 1013, and 1014. It will be appreciated that the charge storage structure 104 facilitates the storage of charge therein, and thereby facilitates storage of data. Additionally, as illustrated in this particular embodiment, layers 1012, 1013, and 1014 are in direct contact with each other (i.e., abutting).

The charge storage structure 104 includes layer 1012 overlying and abutting layer 1011. In accordance with an embodiment, layer 1012 can include a dielectric material, such as those described in accordance with layer 1011. For example, layer 1012 can include silicon dioxide. Layer 1012 and layer 1011 can be distinct and separately formed layers, such as a native oxide layer 1011 and a thermally grown oxide layer 1012. Alternatively, it will be appreciated that layers 1012 and 1011 can be different regions of a commonly formed layer. Layer 1012 can be formed by growth techniques, deposition techniques, and the like.

The charge storage structure 104 further includes a layer 1013 overlying and abutting layer 1012. In accordance with an embodiment, layer 1013 includes a conductive material, such as a metal. According to an alternative embodiment, layer 1013 includes a non-conductive material, such as a nitride material. Other features of layer 1013 will be discussed in more detail herein. Layer 1013 can be formed by growth techniques, deposition techniques, and the like.

The charge storage structure 104 further includes layer 1014 overlying and abutting layer 1013. The layer 1014 can include a dielectric material such as those discussed in accordance with layer 1012. Layer 1014 can be formed by growth techniques, deposition techniques, and the like.

As further illustrated in FIG. 1B, the device 10 includes a layer 1015 overlying the charge storage structure 104. Layer 1015 can include a semiconductive material, a metal and the like. Suitable semiconductive materials can include silicon, germanium, gallium, and combinations thereof. In accordance with one particular embodiment, the layer 1015 includes a doped polysilicon.

The device 10 of FIG. 1B further includes a layer 105 overlying the charge storage structure 104 and the substrate 100. In accordance with a particular embodiment, the layer 105 is a radiation-reactive upper layer. As used herein, the term "radiation-reactive" refers to a layer or material having a high probability of interacting with radiation and further generating or spawning a charged particle/photon in reaction to such interactions with radiation. For example, one such radiation-reactive material is a material that includes boron-10 ($^{10}B$), which is an element having a high probability of interacting with radiated neutrons and spawning an alpha particle and a lithium-7 ($^{7}Li$) particle upon interacting with a neutron. In contrast, other forms of boron, such as boron-11 ($^{11}B$), are not considered radiation-reactive, as such elements do not have a tendency to react with radiated neutrons. Accordingly, materials or layers that include a radiation-reactive material, such as a material having a radiation-reactive element such as boron-10 ($^{10}B$), lithium-6 ($^{6}Li$), cadmium-113 ($^{113}Cd$), and gadolinium-157($^{157}Gd$), (OK) or a combination thereof. Additionally, radiation-reactive materials can be made of materials including such elements, for example, boron nitride including boron-10, boron carbide including boron-10, and lithium nitride including lithium-6.

In accordance with an embodiment, layer 105 is a radiation-reactive layer including a radiation reactive material. For example, according to a particular embodiment, layer 105 includes boron. In accordance with more particular embodiments, layer 105 can include a certain percentage of boron, such that at least about 5% of the boron atoms within the layer are boron-10 atoms. Still, in other embodiments this concentration may be greater, such as at least about 10%, at least about 25%, or at least about 50%. Still, particular embodiments may use a concentration of boron-10 atoms within layer 105 that is not greater than about 80% of the total boron atoms present within layer 105. Still, particular embodiments may use a concentration of boron-10 atoms within layer 105 that is greater than about 80% of the total boron atoms present within layer 105.

Layer 105 can have an average thickness that is at least about 3 microns, particularly in those application using boron-10. In other embodiments, the average thickness of layer 105 can be greater, such as at least about 5 microns, at least about 8 microns, 10 microns, 15 microns or even at least about 20 microns. In accordance with a particular embodiment, the average thickness of layer 105 is within a range between about 3 microns and about 20 microns, and even more particularly between about 5 microns and about 15 microns. Notably, certain materials may be more suitable for use with thicker layers, for example lithium, i.e., lithium-6.

Referring again to the charge storage structure 104, as described previously, layer 1013 can include a charge storage material such as silicon nitride. Still, in other particular embodiments, the layer 1013 can include a radiation-reactive material such as that described in accordance with layer 105. For example, according to an embodiment, a material of layer 1013 includes boron, for example boron nitride, where a concentration of the boron is boron-10. As discussed above in accordance with layer 105, layer 1013 can include certain concentrations of boron-10 atoms as identified above.

While reference to the charge storage structure 104 has been made, wherein layer 1013 can be made of a non-conductive material, such as silicon nitride, it will be appreciated, in other embodiments the charge storage structure 104 can incorporate a conductive layer. For example, the charge storage structure can include an isolated conductive layer, such as a metal-containing layer. Moreover, while the embodiment of FIG. 1B has illustrated a charge storage structure 104 as part of a transistor stack, it will be appreciated that in other embodiments charge storage structures need not be incorporated as part of a transistor stack.

As such, the average thickness of the layer 1013 when using a radiation-reactive material can be within a range between about 1 nm and about 500 nm, such as within a range between about 2 nm and about 250 nm, or even more particularly within a range between about 10 nm and about 100 nm.

FIG. 1B further illustrates regions 102 and 103 within the substrate 100 and underlying portions of the stack 101. In accordance with a particular embodiment, regions 102 and 103 can be implant regions within the substrate 100 suitable for allowing flow of electrons through a transistor that is associated with the stack 101. In accordance with a particular embodiment, regions 102 and 103 can be doped source/drain regions, including a n-type or p-type dopant material. In more particular instances, regions 102 and 103 can include a radiation-reactive material. For example, in accordance with on embodiment, the regions 102 and 103 include boron-10. The region directly underlying the stack 101 is a channel region that can be doped to have the opposite conductivity-type as the source drain regions.

As will be appreciated, a radiation-detecting structure of the device 10 includes substrate 100, the source/drain regions 102 and 103 and channel region within the substrate 100, the stack 101, and layer 105 as described above. As used throughout the subsequent description, a radiation-detecting structure will be generally be understood to incorporate similar elements unless otherwise stated. It will be appreciated that other elements may be considered part of the radiation-detecting structure, for example, other regions, structures, and components that are used to detect the occurrence of a radiation event.

FIG. 1B further illustrates region 1004 within the substrate 100 adjacent to, and in particular, abutting region 103. In one particular instance, region 1004 can be a field isolation region suitable for electrically insulating the source drain region 103 from other adjacent source/drain regions, for example separation of multiple transistors disposed at the substrate 100. In accordance with one embodiment, the region 1004 can include a radiation-reactive material. For example, in certain embodiments, the region 1004 can include a dielectric compound including the radiation-reactive material such as boron nitride, boron carbide, or lithium nitride.

FIG. 2 includes a cross-sectional illustration of a device 11 including a radiation-detecting device in accordance with an embodiment. In particular, the device 11 includes a radiation-detecting structure similar to that described at FIG. 1B with the addition of layer 106 overlying layer 105. In particular, the radiation-detecting structure includes the elements previously identified and the layer 106.

As further illustrated in FIG. 2, the radiation-detecting structure of device 11 includes a layer 106 overlying layer 105. In particular, layer 106 can include a thermalizing material. As used herein, reference to a thermalizing material is reference to a material capable of slowing down a particular type of radiation, thus making it more apt to be detected by the radiation-detecting structure. For example, with respect to neutron radiation, suitable thermalizing materials can include hydrogen-containing materials, deuterium-containing material, and carbon-containing materials. Accordingly, thermalizing materials can include metals, ceramics, polymers, or combinations thereof. In certain particular embodiments, the thermalizing material is a polymer material incorporating such hydrogen-containing materials, deuterium-containing materials, carbon-containing materials, or a combination thereof. For example, in one particular embodiment, suitable polymer thermalizing materials can include polyolefins, polyamids, polyimids, polyesters, polystyrenes, polycarbonates, polyurethanes, polyethers, polysulphones, polyvinyls, and polyactic acids, or combinations thereof.

FIG. 2 further illustrates a thermalizing event with respect to a particle 107. In accordance with a particular embodiment, particle 107 can include a neutron particle traveling on a path 1071 towards layer 106. Upon striking and interacting with layer 106, the neutron particle 107 is slowed, i.e., thermalized, and has a path 1072 through the layer 106 containing the thermalizing material. Upon slowing of the neutron particle 107, it exits layer 106 and travels along path 1073 towards the layer 105 which according to embodiments herein contains a radiation-reactive material. Upon striking the layer 105 containing the radiation-reactive material, such as boron-10, the particle 107, e.g., a neutron, reacts with the boron-10 atom and the resulting reaction generates two particles 1082 and 1081 that exit the layer 105 upon paths 10821 and 10811.

In particular reference to neutron particles, during such a reaction with boron-10, the particles spawned as a result of the interaction between the neutron particle 107 and boron-10 particle 108 result in the generation of an alpha particle and a lithium 7 particle. The emitted particles 1082 and 1081 that result from the interaction of the neutron particle 107 with the boron-10 atom 108 can cause a modification of the charge stored within charge storage structure 104, which can be detected as a change of charge storage state. In one embodiment, the charge-detecting device detects a change of charge storage state as a change in conductive state of a transistor associated with the charge storage structure that has had is charge modified. In particular, it is thought that the generation of a particle/or photon 1081 extending along path 10811, as illustrated in FIG. 2, interacts with the material of the charge storage structure 104 to cause a change of state. In further reference to FIG. 2, in accordance with a particular embodiment, the layer 106 includes a thermalizing material as described herein. In certain other embodiments, other layers within the radiation-detecting structure 11 can include thermalizing materials. For instance, a portion of the charge storage structure 104 can include a thermalizing material. Suitable layers within the charge storage structure containing the thermalizing material can include dielectric layers, such as 1014 and 1012. In accordance with one particular embodiment, the dielectric layers 1014 and 1012 may be particularly suited to include a thermalizing material such as deuterium. For example, formation of such layers may be carried out such that the reactants (e.g., Silane™) include the thermalizing material such as deuterium, such that when the layers 1012 and 1014 are formed, they naturally include the thermalizing material.

FIG. 3 includes a cross-sectional illustration of a device 12 including a radiation-detecting structure in accordance with an embodiment. In particular, FIG. 3 illustrates substantially the same radiation-detecting structure as illustrated in FIG. 2 with the addition of layer 107. According to an embodiment, layer 107 can include a thermalizing material, such as those previously described in accordance with layer 106. The illustrated radiation-detecting structure facilitates thermalization of radiation from above and below the charge storage region 104, improving the probability that non-thermalized radiation will be detected. Moreover, according to a particular embodiment, the charge storage structure 104 can be sealed within the thermalizing material. For example, in a more particular embodiment, the charge storage structure is hermetically sealed within thermalizing material such that it is not exposed to an ambient environment.

Figure 4:
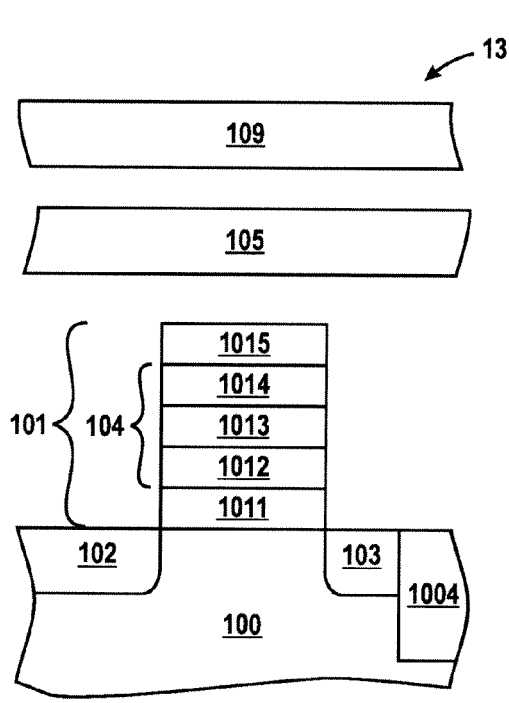
FIG. 4 includes a cross-sectional illustration of a device including a radiation-detecting structure in accordance with an embodiment.

FIG. 4 includes a cross-sectional illustration of a device 13 including a radiation-detecting structure in accordance with an embodiment. In accordance with a particular embodiment, the device 13 can be formed such that it is sensitive to multiple types of radiation. For example, device 13 includes multiple layers of radiation-reactive materials, each layer reactive to different types of radiation, and wherein each of the layers are associated with a single radiation-detecting structure. Accordingly, as illustrated in FIG. 4, the radiation-detecting structure 13 is similar to that described a FIG. 1B and includes a layer 109 overlying layer 105 that includes a radiation-reactive material sensitive to a different type of radiation than that of layer 105. For example, in accordance with one embodiment, layer 105 may include a radiation-reactive material that is sensitive to neutrons, and as such includes boron, while layer 109 includes a radiation-reactive material that is sensitive to a different type radiation, such as gamma ray radiation, and accordingly may include a different material that than in layer 105, such as lead or gadolinium.

Figure 5:
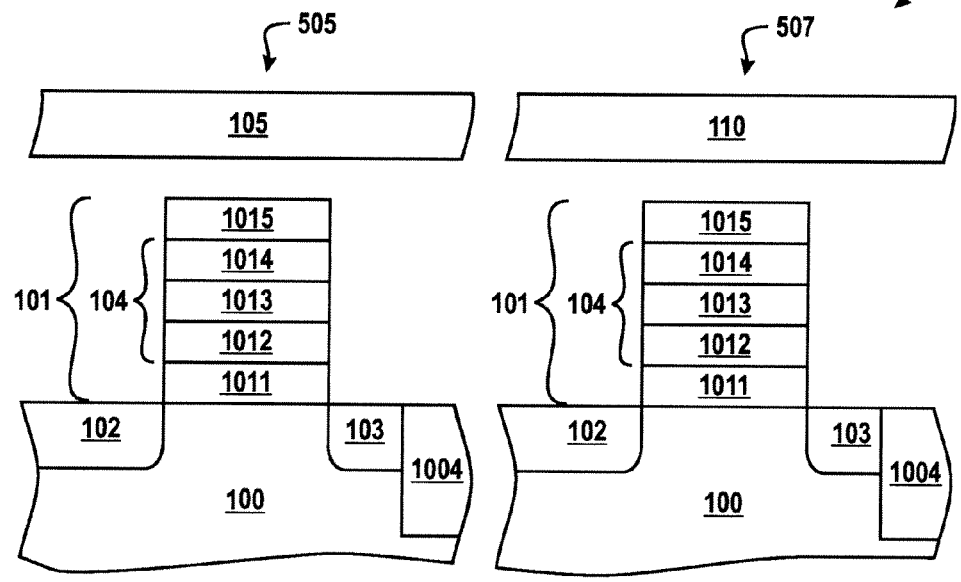
FIG. 5 includes a cross-sectional illustration of a device that includes a radiation detecting structure.

FIG. 5 includes a cross-sectional illustration of a device 14 that includes a radiation detecting structure. Notably, the radiation-detecting structure includes a first radiation-detecting portion 505 and a second radiation-detecting portion 507 separate and spaced apart from the first radiation detecting portion 505. The second radiation-detecting portion 507 includes elements identified with the radiation-detecting structure of FIG. 1B and additionally includes a second set of similarly numbered elements and a layer 110.

In accordance with a particular embodiment, the device 14 includes a radiation-detecting structure having a charge storage structure 104 associated with layer 105, that includes a radiation-reactive material sensitive to a first radiation type, and a second radiation-detecting portion includes a second charge storage structure 504 associated with a layer 110, including a second radiation-reactive material sensitive to a second radiation type. Such a configuration facilitates the detection and reaction of components within the same substrate to multiple forms of radiation, including for example, neutron particles, gamma ray radiation, x-ray radiation, and other types of radiation and subatomic particles.

Accordingly, it will be noted that FIG. 4 illustrates a radiation-detecting structure having a single stack associated with multiple radiation-reactive materials, while FIG. 5 illustrates an alternative embodiment, in which a radiation-detecting portions includes two distinct and different associated elements (i.e., stacks), such that each portion is sensitive to a different radiation type. With regard to the later, such a configuration may be advantageous when an array of stacks are formed at a single substrate.

FIG. 6 includes a cross-sectional illustration of a device including a radiation-detecting structure in accordance with an embodiment. In particular, radiation-detecting structure includes a first radiation-detecting portion 606 and a second radiation-detecting portion 608 spaced apart from the first radiation-detecting portion 606, wherein each portion is associated with two separate transistor structures similar to that described at FIG. 5, with layer 110 excluded from the second radiation-detecting portion 608. The second radiation-detecting portion 608 includes the same region and layers as the structure described in FIG. 1B. Notably, the first radiation-detecting portion 606 includes layer 106 overlying layer 105, which as previously described, can include a thermalizing material. The second radiation-detecting portion 608 includes an overlying layer 605, which can include a radiation-reactive material, but does not include including a second overlying layer having thermalizing material, as associated with the first radiation-detecting portion 606. As such, the second radiation-detecting portion 608 is exposed to the environment external to the thermalizing material. Accordingly, the first radiation-detecting portion 606 will be more capable of detecting higher energy radiation particles as opposed to the second radiation-detecting portion 608 since it utilizes the thermalizing material within layer 106.

FIG. 7 includes a cross-sectional illustration of a device 16 including a radiation-detecting device in accordance with an embodiment. In particular, FIG. 7 illustrates a radiation-detecting device of device 161 including a neutron-detecting structure as described herein, where device 161 is disposed within a housing 162. In accordance with one embodiment, the neutron-detecting structure of device 161 can include the elements of the radiation-detecting structures previously described. In accordance with a particular embodiment, the neutron-detecting structure of device 161 can include an array of charge storage structures.

The housing 162 can be a container sufficient to engage or contain therein the neutron-detecting structure of device 161. For example, in accordance with an embodiment, the housing 162 can include a metal, polymer, or ceramic material, or any combination thereof. In accordance with a particular embodiment, the housing 162 can substantially surround the neutron-detecting structure of device 161, such that it covers an majority of the external surface area of the neutron-detecting structure 161.

As further illustrated, the device 16 includes a metal-containing shielding 163 overlying a portion of the housing 162 and a portion of the neutron-detecting structure of device 161. In particular, the metal-containing shielding 163 can include a radiation-absorbing material, and more particularly, a neutron-absorbing material. Herein, a radiation-absorbing material is one that is capable of trapping or stopping certain forms of radiation from passing through. For example, a neutron-absorbing material is a material that has a high probability of intercepting a neutron and interacting with a neutron, i.e., a high cross-section. For example, certain suitable neutron-absorbing materials have a cross-section of at least about 1000 barns, and more particularly at least about 3000 barns. According to an embodiment, suitable neutron-absorbing materials can include metals, such as cadmium, gadolinium, or a combination thereof.

As further illustrated in FIG. 7, the metal-containing shielding 163 can be patterned, such that it only allows radiation traveling along certain predetermined vectors to interact with the neutron-detecting structure, while radiation traveling along other vectors that strike the metal-containing shielding 163 and are absorbed. For example, as illustrated in FIG. 7, the metal-containing shielding 163 can be patterned such that it is in the form of a grating.

FIG. 8 includes a cross-sectional illustration of a device 800 including a radiation-detecting device in accordance with an embodiment. The device 800 includes the elements previously illustrated in FIG. 7 with the addition of a layer 164 overlying the housing 162. According to an embodiment, the layer 164 can include a neutron-absorbing material such as those previously described. As such, neutrons 168 which are directed at the neutron-detecting structure 161 along a collinear orientation are capable of passing through the metal-containing shielding 163 and interacting with the neutron-detecting structure 161. By contrast, neutrons traveling along other directions, such as neutron 169, impact the layer 164 containing the neutron-absorbing material and are absorbed and thus not allowed to interact with the neutron-detecting structure 161. As such, the device 800 includes a highly directionalized radiation-detecting structure that is suited to detect radiation traveling along certain directions.

FIG. 9 includes a cross-sectional illustration of a radiation-detecting device in accordance with an embodiment. In particular, the radiation-detecting device 17 includes a radiation-detecting structure 10 including those elements described previously. In addition, the radiation-detecting device 17 includes a metal-containing structure 171 in the form of a grating to control the passage of radiation therethrough. As such, the radiation-detecting structure 10 is integrated at a substrate 100 such that it can be exposed to radiation traveling along a first plurality of vectors and substantially unexposed to radiation traveling along a second type of vector. That is, radiation illustrated in FIG. 9 traveling along vectors V1 and V2 substantially passes through the metal-containing structure 171, including a radiation-absorbing material, and interacts with the layer 105 including the radiation-reactive material. By contrast, radiation traveling along vector V3 is at an angle such that it is not allowed to pass through the metal-containing structure 171 and is absorbed therein, thus not striking the layer 105 and interacting accordingly.

As further illustrated in FIG. 9, the vectors V1 and V2 may be averaged such that they have an average vector VA defining a vector sufficient to pass through the metal-containing structure 171. By contrast, the radiation traveling along vector V3 can have a different average vector, including all other vectors that are insufficient to pass through the metal-containing structure 171 defining a separation angle between those vectors allowed to pass through and those vectors incapable of passing through the metal-containing structure 171. In accordance with one embodiment, the difference between the first average vector and the second average vector is at least about 90°.

In accordance with a particular embodiment, the metal-containing shielding 171 may be formed to overlie layer 105. The metal-containing shielding 171 can be formed by a photolithography technique.

FIG. 10 includes a cross-sectional illustration of a device 18 including a radiation-detecting structure in accordance with an embodiment. In particular, the device 18 includes a base 181, a substrate 182 overlying the base 181, where the substrate 182 is part of an integrated circuit device 183. The integrated circuit 183 further includes a logic circuit 185 electrically coupled to the radiation-detecting structure 184. A cover 186 overlies the radiation-detecting structure 184.

The base 181 provides a rigid support suitable for the integrated circuit 183, and particularly the substrate 182. As such, the base 181 can include a metal, polymer, or ceramic material. In accordance with one embodiment, the base 181 includes a ceramic material such as an oxide, carbide, nitride, boride, or a combination thereof. In accordance with another embodiment, the base 181 can include a radiation-absorbing material, more particularly a neutron-absorbing material. As such, suitable neutron-absorbing materials can include metals, such as cadmium or gadolinium.

The base 181 can further be configured such that it has a size that is greater than that of the substrate 182. For example, the base 181 can have a diameter and thickness greater than that of the substrate 182 and the integrated circuit 183. Additionally, while not illustrated in the embodiment of FIG. 10, the base 181 can be shaped such that it covers and comes in direct contact with a majority of the external surface area of the substrate 182. For example, in one certain embodiment the base 181 wraps around the sides of the substrate 182. In another particular embodiment, the substrate 182 can be disposed within an interior space within the base 181, such that the substrate 182 is recessed within an opening in the base 181.

The substrate 182 can provide a support suitable for formation of the radiation-detecting structure 184 thereon. In accordance with an embodiment, the substrate can include a semiconductor material, such as silicon, germanium, and the like. More particularly, in another embodiment, the substrate can include a single crystal material, such that in certain instances the substrate 182 can be an entire single crystal wafer used in processing microelectronic devices, or a portion of an entire single crystal layer. For example, in one particular embodiment, the substrate 182 is a semiconductor-on-insulator material, or bulk semiconductor material. According to an alternative embodiment, the substrate 182 can include an amorphous material, such that it can be a glass, and more particularly a glass panel, such as used in the LCD display industry.

Generally, the substrate 182 has a size sufficient to hold the structures thereon. As such, according to one embodiment, the substrate 182 can have a diameter of at least about 10 cm. In other embodiments, the substrate 182 has a greater diameter, such as at least about 15 cm, at least about 20 cm, and more particularly within a range between about 10 cm and about 60 cm.

In further reference to the geometry of the substrate 182, generally the substrate 182 has a thickness such that it is sufficiently rigid and strong to be mounted on the base 181 and support the radiation-detecting structure 184. As such, in one embodiment, the substrate has an average thickness of at least about 0.5 mm. In other embodiments, the substrate has a thickness that is on the order of at least about 0.75 mm, at least about 1 mm, at least about 3 mm, and particularly within a range between about 0.5 mm and about 5 mm, such that in certain particular embodiments the substrate can be an unpolished wafer.

The radiation-detecting structure 184 is disposed at the substrate 182. In particular, the radiation-detecting structure 184 can include a memory array having an array of charge storage structures. Notably, the radiation-detecting structure 184 can include features previously described and illustrated in FIGS. 1-6. In fact, referring briefly to FIG. 11, a portion of the radiation-detecting structure 184 is illustrated. In particular, the radiation-detecting structure 184 includes an array of charge storage structures including charge storage structures 1831, 1832, and 1833, wherein each of the charge storage structures can include those components illustrated in FIG. 1B. In accordance with a particular embodiment, the radiation-detecting structure 184 includes an array of charge storage structures such that the radiation detecting structure 184 includes not less than about 100 charge storage structures. Other embodiments may utilize more, such as not less than about 200, not less than 300, or even not less than 500 charge storage structures.

Referring again to FIG. 10, a logic circuit 185 is disposed at the substrate 182. In accordance with a particular embodiment, the logic circuit 185 is electrically coupled to the radiation-detecting structure 184 such that it is capable of controlling the charge storage structures and performing certain operations, such as various operations associated with detecting the occurrence of a radiation event.

As such, it will be appreciated that the combination of the substrate, radiation-detecting structure 184, and logic circuit 185 can form at the integrated circuit 183 overlying the base 181. As such, other electrical components (e.g., capacitors, diodes, etc.) not currently illustrated may be included in the device 18, and more particularly disposed at the substrate 182 for interaction with the logic circuit 185 and radiation-detecting structure 184.

The device 18 further includes a cover 186 overlying the radiation-detecting structure 184, and more particularly overlying the upper surface of the integrated circuit 183. The cover can provide protection from environmental factors, such as dust and the like that may damage the components of the integrated circuit 183. In accordance with a particular embodiment, the cover 186 can be a flexible material, and may include a polymer. In certain embodiments, the cover 186 may be mechanically coupled to a portion of the base 181. Still, in other embodiments, the cover 186 may be mechanically coupled to portions of the substrate 182.

In fact, according to one particular embodiment, the cover 186 can be a flexible circuit, having conductive busses and electrodes disposed therein for electrical connection to the integrated circuit 183. That is, according to one embodiment, the cover 186 can be an interposer capable of providing electrical connections between an upper surface of the integrated circuit 183 and external contact of the interposer. For example, cover 186 can include electrical connections or interconnects 1841 and 1842 extending from an upper surface of the cover 186 to an upper surface of the integrated circuit 183 for electrical connection to components within the integrated circuit 183, such as the radiation-detecting structure 184.

FIG. 12 includes a cross-sectional illustration of a device including a radiation-detecting structure in accordance with an embodiment. In particular, the device 19 includes a housing 190 and a plurality of radiation-detecting structures 191, 192, and 193 (191-193) contained therein. In particular, the radiation-detecting structures 191-193 can be stacked and aligned within the housing such that they are suitably arranged to detect a radiation event with a higher probability. As such, in accordance with one particular embodiment, the radiation-detecting structures 191-193 can include those radiation-detecting structures as illustrated in FIG. 1B, that is a device having a single charge storage structure. In such embodiments, the device can be a portable device, capable of being integrated within portable or personal devices.

Alternatively, the radiation-detecting structures 191-193 can include those devices as illustrated in FIG. 10 including a base, substrate, radiation-detecting structure at the substrate, and a cover. Such a design can incorporate multiple radiation-detecting structures, each radiation-detecting structure having an array of charge storage structures. As will be appreciated, such a structure may be larger than structures incorporating a single charge storage structure. Still, such structure can be portable, but may further be mountable at strategic locations.

As further illustrated in FIG. 12 and in accordance with a particular embodiment, the radiation-detection structures are aligned within the housing such that the major surfaces of each of the substrates (or bases) are substantially coplanar with each other. Moreover, in accordance with another particular embodiment, the radiation-detecting structures 191-193 can be laterally spaced apart from each other and separated by material layers 196 and 197. In accordance with a particular embodiment, material layers 196 and 197 can include a thermalizing material. Utilization of a thermalizing material between the radiation-detecting structures 191-193 can improve the probability of detecting a radiation event.

Figure 13:
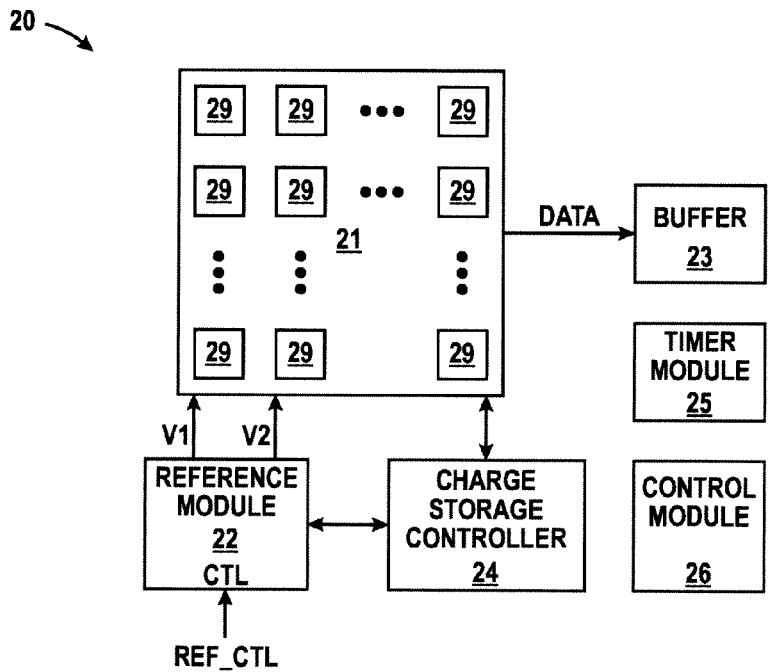
FIG. 13 illustrates a device that includes a radiation-detecting structure to detect radiation.

FIG. 13 illustrates a device 20 that includes a radiation-detecting structure to detect radiation. Specifically, the radiation-detecting structure includes an array of charge storage structures 21, a reference module 22, a buffer 23, charge storage controller 24, a timer module 25, and a control module 26. The array of charge storage structures 21 includes a plurality of individual charge storage structures 29. It will be appreciated that each of the charge storage structures 29 can represent a charge storage structure, such as structure 104 previously described, which can be associated with a transistor device, or other electronic device.

The device 20 represents an integrated circuit device, whereby the elements illustrated at FIG. 8 represent various devices integrated at a common substrate, such as a semiconductor substrate. Reference module 22 provides voltage reference signals to the array of charge storage structures 21. For example, as previously described, the charge storage structures can be associated with corresponding transistors, and the reference voltages v1 and v2 provided by the reference module 22 can be used to modify charge stored at each of the charge storage structures 29, and to bias circuitry associated with a charge storage structure to determine its current storage state. The reference module 22 can be a controllable digital signal reference module. As such, the value of voltage reference signals provided by the reference module 22 can be selectably controlled based upon reference control input information received at its input labeled CTL. The signal labeled "Ref_CTL" can be received from a control module 26, or from other portions of the device 20.

The control module 26 can be used to control various portions of device 120 to determine a state of each of the charge storage structures 29. In one embodiment, the control module 26 provides control signals to the reference module 22 to determine whether or not a transistor associated with a specific storage structure 29 is in a conductive or non-conductive state for a specific read voltage applied at its control gate. By determining whether any one of the charge storage structures 29 is in a different read state than expected, a radiation event can be detected.

In accordance with a specific embodiment, the control module 26 can operate during a detect operation to load state information from each of the charge storage structures 29 into a buffer 23, which can be a memory array such as an SRAM, to allow for fast access. In other words, control information can be provided from a control module 26 to the buffer 23 and the array of charge storage structures 21 in order to provide state information of the charge storage structures 29 to the buffer 23. Once the state information is stored at buffer 23, the states of the each charge storage structure 29 can be modified to an original desired state, and the previous state information can be read from the buffer in an efficient manner.

Charge storage controller 24 is illustrated is connected to the array of charge storage structures 21 and the reference module 22. The charge storage controller 24 controls an amount of charge stored at each one of the charge storage structures 29. Operation of the charge storage controller 24 can be better understood with respect to FIG. 14.

Figure 14:
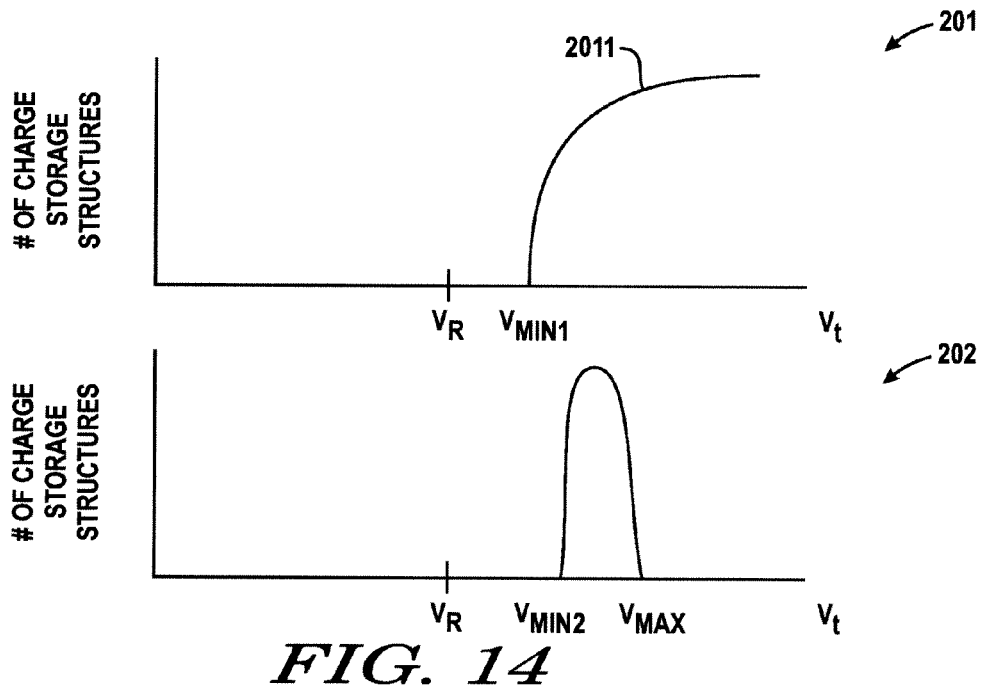
FIG. 14 includes two graphs including plots of number of charge storage elements versus their corresponding threshold voltages.

FIG. 14 illustrates a graph 201 and a graph 202. The curve 2011 of graph 201 represents the number of charge storage elements 29, the x-axis, that are associated with a corresponding transistor having a specific voltage threshold indicated along the y-axis. For example, referring to charge storage structure 104 as previously described, it is incorporated within a transistor that will either be conductive or non-conductive, depending upon a read voltage ($V_R$) applied at its control gate. The voltage $V_R$ represents a read voltage applied to a transistor, such as that associated with charge storage structure 104 of FIG. 1B. Therefore, graph 201 represents the distribution of voltage thresholds amongst all the members of a charge storage array prior to being exposed to any radiation. For example, after manufacturing, graph 201 can represent a distribution of voltage thresholds for transistors associated with charge storage structures after manufacturing, whereby each transistor has a voltage threshold at or above a minimum voltage $V_{MIN1}$. However, as illustrated at graph 201, the threshold voltages are widely distributed among $V_{MIN1}$. In order to better detect a radiation event, which is assumed for purposes of illustration to shift a voltage threshold of a transistor to a lower voltage by a deterministic amount, it can be desirable to set an amount of charge at each one of the charge storage structures such that its associated transistor will have a voltage threshold within a relatively narrow distribution. Moreover, the amount of charge at each one of the charge storage structures can be set such that it distinguishes between radiation events, that is particular types of radiation can be detected and other types need not be detected. For example, the amount of charge can be set to determine neutron-based radiation events and not gamma-ray radiation events.

For example, the charge storage controller 24 of FIG. 13 can be used to set an amount of charge at each one of the charge storage structures 29 by providing or removing electrons into the charge storage structure. By applying and removing electrons, and accessing a charge storage structure's transistor to determine a current threshold voltage, a tighter distribution of voltage thresholds for each one of the charge storage structures can be obtained. For example, the voltage range between $V_{MIN2}$ and $V_{MAX}$ can be not greater than about 2 volts, not greater than about 1 volt, or not greater than about 0.6 volts. It will be noted that the voltage $V_{MIN2}$ is greater than the read voltage $V_R$ in the embodiment illustrated. It will also be noted that the values of each of the voltage indicated, for example $V_R$, $V_{MIN2}$ and $V_{MAX}$ can be selectively controlled based upon control signal Ref_CTL, which is provided to the reference module 22.

The timing module 25 can be used to control when periodic accesses by the radiation detection structure are made. For example, during a detection mode of operation, the timer module would maintain a count, or a time to determine when to read information stored at the charge storage structures 2 to determine if a radiation event has occurred. During this detection mode, no power need be applied to the array of charge storage structures 21, nor to the elements used to detect a radiation event, in that the charge storage elements as previously described do not need applied operating power to have their charges modified, as the operating power needed to modify the charge stored at a charge storage structure is provided by the radiation being detected in response to a radiation event. The radiation detection structure that includes a charge storage structure of the array of charge storage structures 21, and its associated circuitry only needs to be powered when the information at the array of charge storage structures 21 is being accessed.

It will be appreciated that the various devices and methods discussed above can be used in a variety of applications. For example, the applications can include imaging applications and monitoring applications.

With respect to imaging applications, it will be appreciated that the devices disclosed herein can be used to create images for various scientific applications that need an image based upon the detection of radiation particles generated as a result of an analysis of particle collisions.

Another example of an imaging application would include a medical application, such as part of a medical treatment. For example, during a cancer treatment, a desired location of the body has been tagged, e.g., introduced, with a specific radiation-reactive material, such as a material that includes boron 10, that is subsequently exposed to a radiation source, such as a neutron beam. It will be appreciated that in an application such as this, a detection device such as that described herein could be used as an imaging device placed behind the portion of the body being treated to determine what portion of a neutron stream is being absorbed by the area being treated. For example, if a known amount of neutrons are being generated by a neutron stream, and a count at the neutron detector placed behind the patient indicates that none of the neutrons are being absorbed by the body, a realignment may be in order, or an indication that the treatment may be stopped. Alternatively, if a given portion of the neutrons are being absorbed, that can be detected and detected by the imaging device placed behind the patient, thereby allowing an amount of radiation applied to the affected part of the body to be monitored. Such applications could be useful in surgical applications.

Examples of monitoring applications include security applications, such as Homeland Security applications to monitor the presence of nuclear materials, and health physics applications. The monitoring can be for detecting the presence of a nuclear material, or to accumulate the amount of exposure a specific location has experienced with respect to a radiation type being detected.

A number of mobile device applications are anticipated. These mobile device applications can include personal mobile devices and transportation vehicles devices. For example, personal mobile devices can include electronic and non-electronic devices. Personal mobile electronic devices include such things as personal digital assistant devices, cell phones, computers, and any other hand-held or portable electronic personal device. Non-electronic mobile devices can include articles of clothing and accessories, such as badges, purses, wallets, and the like.

Examples of transportation vehicles can include land-based transportation vehicles, water-based transportation vehicles, and air-based transportation vehicles.

Stationary monitoring applications are also anticipated. For example, the devices and methods described herein could be used for monitoring radiation at stationary locations. For example, the stationary location could at a nuclear reactor site, inside of a building, outside of a building, or any other locations where it would be useful to determine whether or not a neutron source has been detected.

It is anticipated that various applications would include incorporating a device or method as described herein with any number of other support modules. For example, additional support modules could include support modules capable of determining a location, such as a global positioning system module, a cell phone capable of triangulating to determine a general location, as well as other methods of determining location. In addition, clocks and timers capable of recording when an event occurred would also be anticipated with any of the applications anticipated herein.

In addition, the method and devices herein could be used to monitor an inventory of known radiation sources. For example, a device could be placed at a storage site of a radiation source to determine whether or not any material that generates a radiation material is removed from the storage site by monitoring a level of radiation over a period of time, and if the level of radiation decreases, indicating that a quantity of radiation source has been removed, providing an indication as such.

Another application would be to have a defined communication network whereby each of the individual devices described herein would be associated with a unique ID, either integrated on the device itself, or associated with an application of the device, whereby the device could communicate information to a central location whereby presence of radiation information is monitored. In one embodiment, such a clearing house would require each device reporting to it to have a unique ID, which could be assigned by the clearing house. Such a unique ID could be programmed and integrated onto the device itself or associated with an application of the device. Such information can be communicated of a network such as the internet, or wirelessly via satellite, or any combination of available networks.

It would be anticipated that the devices and methods herein can be located at public transportation locations, such as shipping locations, which would include both air and water shipping locations, as well as other locations such as railroad locations.

Nitride Storage Memory Cell

The following discussion associated with FIGS. 15 through 31 describes other exemplary embodiments of the invention including the results of testing performed on an exemplary embodiment. It will be apparent to those of skill in the art that aspects of the embodiments described in the following discussion can be combined with aspects of the exemplary embodiments previously described.

Figure 15:
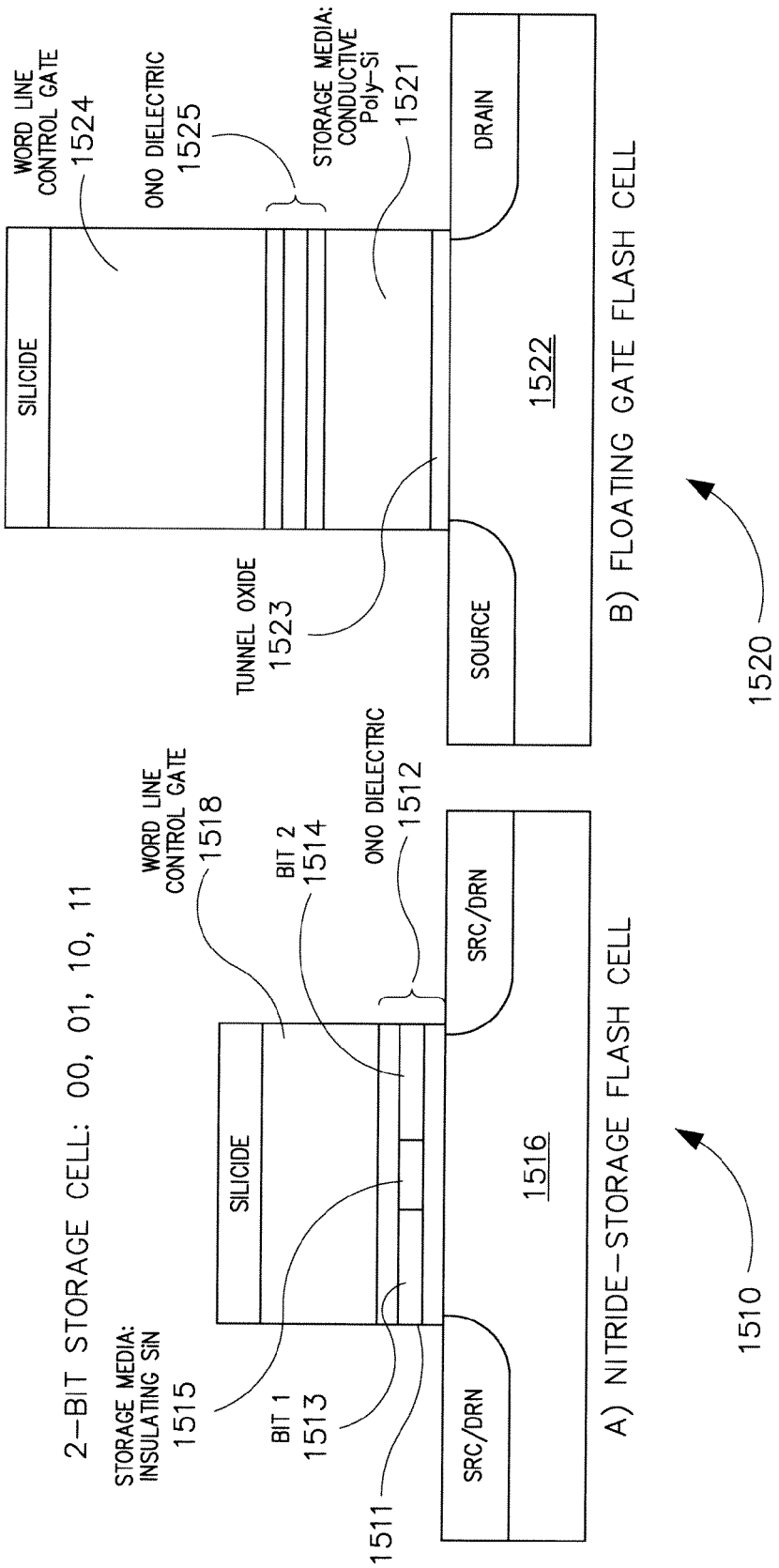
FIG. 15 includes a cross-sectional illustration of two charge storage elements in accordance with an embodiment.

FIG. 15 illustrates exemplary floating gate memory cell 1520. Floating gate memory cell architecture (FG) uses a conductive media 1521 for charge storage. Stored charges are delocalized in the conductive storage media of the floating gate memory cell. The floating gate is insulated by the tunnel oxide 1523 between the floating gate and the substrate 1552, and oxide-nitride-oxide dielectrics 125 between the floating gate and the control gate 124.

In contrast, the exemplary nitride storage memory cell architecture (NS) 1510 uses a non-conductive dielectric 1511 for charge trapping. Trapped charge is localized in the charge trapping layer, e.g., a nitride layer 1511 in the ONO layer 1512 of an NS device. In the exemplary architecture 1510 of FIG. 15, the ONO layer 1512 comprises a nitride layer positioned between two oxide layers, such as layers of $SiO_2$. The ONO layer 1512 sits on substrate 1516 and control gate 1518 is located on top of the ONO layer 1512. For mirror bit NS devices, two bits of charge can be trapped on opposite lateral ends 1513 and 1514 of the nitride layer 1511. Other NS device architectures can store between one (1) and four (4) bits in the charge trapping layer. Although the architecture 1510 will be referred to herein as an NS cell, it should be understood that in other embodiments the charge trapping layer may comprise materials other than nitride.

FIG. 15 illustrates the differences between the structure of an NS memory flash cell 1510 with that of a FG flash cell 1520. The nitride-storage cell 1510 stores two bits per cell, i.e., 00, 01, 10, and 11, in a dielectric charge trapping medium, such as the nitride layer 1511 of the ONO dielectric layer 1512. The trapped electrons are held in trapping sites in the nitride layer that are localized in two areas 1513, 1514, one on either side of the nitride layer 1511.

In FG cells, the charge is stored in a conductive block of highly doped polysilicon that is the floating gate 1521 of the memory cell 1520. The conductive floating gate 1521 is isolated from the silicon substrate 1522 by a tunnel oxide ($SiO_2$) layer 1523 below and from the control gate 1524 by an ONO layer 1525. Since the floating gate 1521 is conductive, the stored electrons are delocalized within the polysilicon block. In contrast to the FG cell 1520, the NS cell 1510 stores only a fraction of the number of electrons per cell, typically about 25%, and in a much smaller physical area than the FG cell 1520.

The threshold voltage ($V_t$) of a memory cell transistor is the minimum voltage at which the cell changes state and is a function of the amount of negative charge trapped in the cell. Cells with large negative charge trapped exhibit a high $V_t$ and are considered to be in the '0' state. Cells with less trapped charge have lower $V_t$. Cells with little or no trapped charge have low $V_t$ and are considered to be in the "1" state.

Neutron-Reactant Material and the Physics of a Neutron Detector

Figure 16:
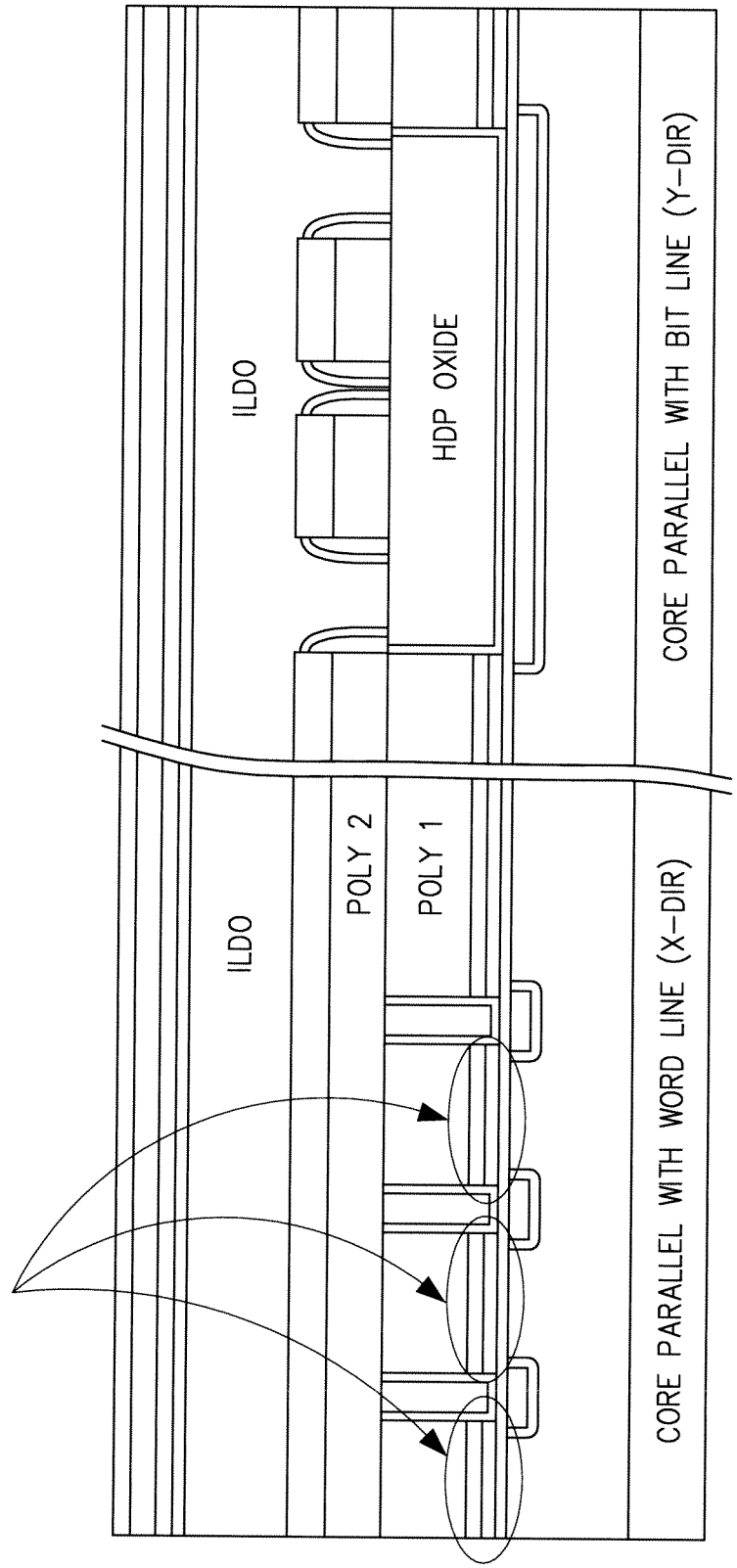
FIG. 16 includes a cross-sectional illustration from the x direction and a cross-sectional illustration from the y direction of a charge storage element in accordance with an embodiment.

Interconnects in semiconductor devices, including flash memory, are fabricated with interlayer dielectric (ILD) films to isolate metal layers from each other to prevent interconnect shorts. In many devices, the first (and sometimes all) of the ILD film stacks comprise a boron-phosphorous-doped Tetra-Ethyl Ortho-Silicate (BPTEOS) glass film that typically contains about 4%-5% boron by weight. The location of the ILD layer in a typical semiconductor device is shown in FIG. 16 with the designation ILD0. The boron is typically in its natural isotopic abundance, e.g., 20% $^{10}$B, 80% $^{11}$B.

Of these two isotopes, $^{10}$B has a higher cross-section for thermal neutron capture (3837 barns of 1/v neutrons) through the reaction $^1$n+$^{10}$B→$^7$Li+$^4$He. As shown in FIG. 17, thermal neutron 1702 capture by the $^{10}$B nucleus 1710, will result in nuclear fission of the excited state $^{11}$B* 1720, emitting two energetic particles, $^4$He ($\alpha$-particle) (1.42 MeV) 1722 and $^7$Li (0.847 MeV) 1724, typically with gamma radiation 1726. The energy levels indicated in FIG. 17 for the thermal neutron 1702, the helium nucleus 1722, the lithium nucleus 1724 and the gamma ray 1726 are representative values.

If this capture occurs in the BPTEOS film of a solid state device, the fission fragments can penetrate deeply into the device and are decelerated by collisions with the nuclei of the atoms in the chip in a manner similar to ion implantation used to dope the semiconductor devices during manufacturing. The energy of the ions is released through a number of channels, for example, phonons, crystal lattice damage, and ion recoil. Most of the ion energy cascades down to the creation of electron-hole pairs formed in the valence and conduction bands of the solid. Since solids normally have no internal electric fields to provide a driving force to separation, these electron-hole pairs will recombine and the energy will dissipate as lattice heating. However, when electric fields are present, such as in the powered-on state for most devices, the electron-hole pairs can separate creating charges in the device. The migration of these charges in the device has been shown to have deleterious effects on a number of devices. For example, $^{10}$B fission events triggered by background thermal neutrons from cosmic rays have been shown to cause a significant fraction of the soft bit error rate in Dynamic Random Access Memory (DRAM) when BPTEOS films incorporating $^{10}$B are used in these devices as reported by Robert C. Baumann and Eric B. Smith, *Neutron-Induced Boron Fission as major Source of Soft Errors in Deep Submicron SRAM Devices*, IEEE Symposium Series; 38$^{th}$ Annual International Reliability Physics Symposium, San Jose, Calif., 2000.

Figure 18C:
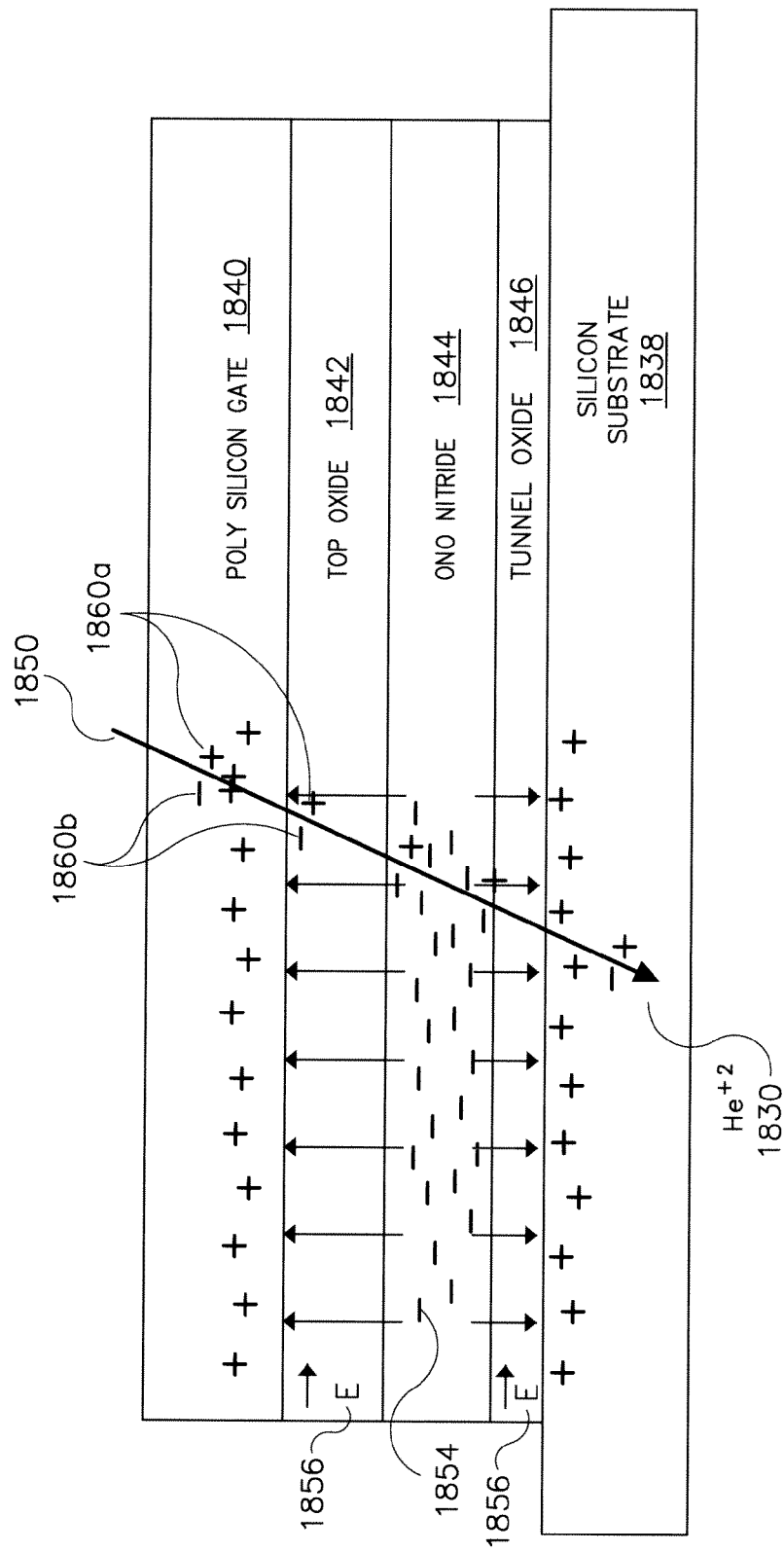

FIGS. 18A, 18B, and 18C illustrate an exemplary $^{10}$B fission event in the context of a solid state semiconductor device. FIG. 18A shows a neutron 1805 passing through a portion of an exemplary solid state device containing a $^{10}$B film 1810. The exemplary solid state device shown in FIG. 18A also comprises multiple NS memory cells 1835 mounted on a substrate 1838. The neutron 1805 interacts with a $^{10}$B atom 1815 resulting in a fission event. The fission event produces a $^7$Li nucleus 1820 and an alpha particle 1830. In the example shown in FIG. 18A, the alpha particle 1830 passes through memory cell 1825 and disturbs the cell such that its state changes.

Exemplary FIG. 18B illustrates in greater detail the effects of the alpha particle 1830 passing through exemplary memory cell 1825 from FIG. 18A. Exemplary FIG. 18B shows the polysilicon gate 1840 and the ONO layer resting on silicon substrate 1838. The ONO layer comprises a top oxide layer 1842, a charge trapping layer 1844, and a tunnel oxide layer 1846. An electric field exists between the negatively charged charge trapping layer 1844 and the polysilicon gate 1840. Another electric field exists between the negatively charged charge trapping layer 1844 and the silicon substrate 1838. As the positively charged alpha particle 1830 passes through the memory cell 1825, it induces electron-hole pairs in the layers of the memory cell 1825. The electron-hole pairs, represented by positive and negative symbols in FIG. 18B, appear along the path of the positively charged alpha particle 1830.

Exemplary FIG. 18C illustrates in further detail the effects of the alpha particle passing through a memory cell. Exemplary FIG. 18C illustrates the effect of an ionized particle, such as alpha particle 1830 passing through memory cell 1825 along track 1850. FIG. 18C illustrates the trapped electrons 1854 localized in the nitride layer 1844. This configuration results in net electric fields 1856 in the ONO dielectric films. These electric fields in the charge trapping region provide a driving force on the electron-hole pairs, such as 1860*a* and 1860*b*, generated by the passage of fission fragments. The driving force from the electric fields forces the electron-hole pairs 1860*a* and 1860*b* to separate. The electron-hole pairs will be generated along the track 1850. The electric field 1856 causes the electron-hole pairs to separate with the electron 1860*b* migrating towards the positively charged polysilicon gate 1840 and the hole 1860*a* migrating towards the negatively charged nitride layer 1844. These holes then have a high probability to annihilate the trapped electrons in the nitride layer 1844. The reduction of trapped charge lowers the threshold voltage of the transistor, in effect switching the memory state of the cell. Moreover, because NS-based cells are non-volatile, once an NS cell is put into a programmed state, this $V_t$ shift can occur even if the device is not powered, and will allow the device to function as a neutron detector even in a passive mode. For $^{10}$B neutron-reactant material ("NRM"), the length of the mean free path of reaction particles ($^4$He, $^7$Li) requires the NRM layer to be in close proximity of the charge trapping layer.

While the process illustrated in FIGS. 18A, 18B, and 18C is in the context of an alpha particle generated by fission from a collision between a neutron and a $^{10}$B atom, a similar process can occur with the passage of other charged particles through a cell with a charge trapping layer like that illustrated in architecture 1510 of FIG. 15. For example, other charged particles passing through a charge trapping cell will generate electron-hole pairs. These electron-hole pairs will be separated by the electric field created by the charge trapping layer and alter the number of electrons stored in the charge trapping layer.

In contrast, in the floating gate memory architecture, the effect of charged particles passing through the cell is much weaker. In the floating gate architecture, the electric fields are weaker because the charges in the conductive storage layer 1521 of FIG. 15 are not localized and are free to move about to the lowest energy level. Furthermore, floating gate cells store 2-3 times the number of electrons, resulting in smaller $V_t$ shifts per lost electron. For an FG memory cell, electric fields are also present in the ONO and tunnel oxide layers; however, since the stored charge is delocalized and uniform, these fields are weaker and more uniform than for an NS cell. Therefore, the separation driving force for the electron-hole pairs in these layers, i.e., the electric field, is significantly weaker than for the ONO layer in the NS cell. Furthermore, once they separate, the electrons and holes have on average a significantly longer distance to travel in an FG cell before reaching charges in the gate, floating gate, or substrate to annihilate stored charges. In the floating gate architecture, the electric field is zero within the charge storage layer 1521 because it is a conductor. Any ion-induced electron-hole pair generated in the floating gate will quickly recombine and no net charge is lost from the cell. The differences in electric fields result in a much lower rate of storage node charge loss for the FG cell than trapped charge loss for the NS cell. Further, since significantly more electrons are stored in a floating gate, the $V_t$ shift per lost charge is also substantially less. Combined, these effects explain why NS-based flash memories are significantly more sensitive to neutrons than FG-based flash memories.

The neutron reactive material (NRM) described above is $^{10}B$. In its naturally occurring form, Boron typically comprises 20% of $^{10}B$ and 80% of $^{11}B$. The performance of the neutron detector can be improved by increasing the percentage of $^{10}B$ in the NRM. For example, the NRM layer can be formed of borophosphosilicate glass (BPSG) having a relatively high concentration of $^{10}B$. In exemplary embodiments the amount of $^{10}B$ in the BPSG can be between 50%-100%, or between 80% to 100%, or between 95% and 100%. The BPSG can be formed using conventional BPSG deposition which includes forming a layer of PSG and selectively implanting $^{10}B$ to increase the concentration.

While $^{10}B$ is described as the NRM used in the exemplary embodiments described herein, other NRMs may also be used, such as $^6Li$ or $^{235}Ur$. Furthermore, the thickness of the NRM-containing layer is selected to allow penetration of some of the particles emitted from the fission process. Typically thicknesses for the NRM-containing layer can range from 2000-5000 angstroms.

Tested Exemplary Embodiment—Phase 0 (90 nm)

Figure 19:
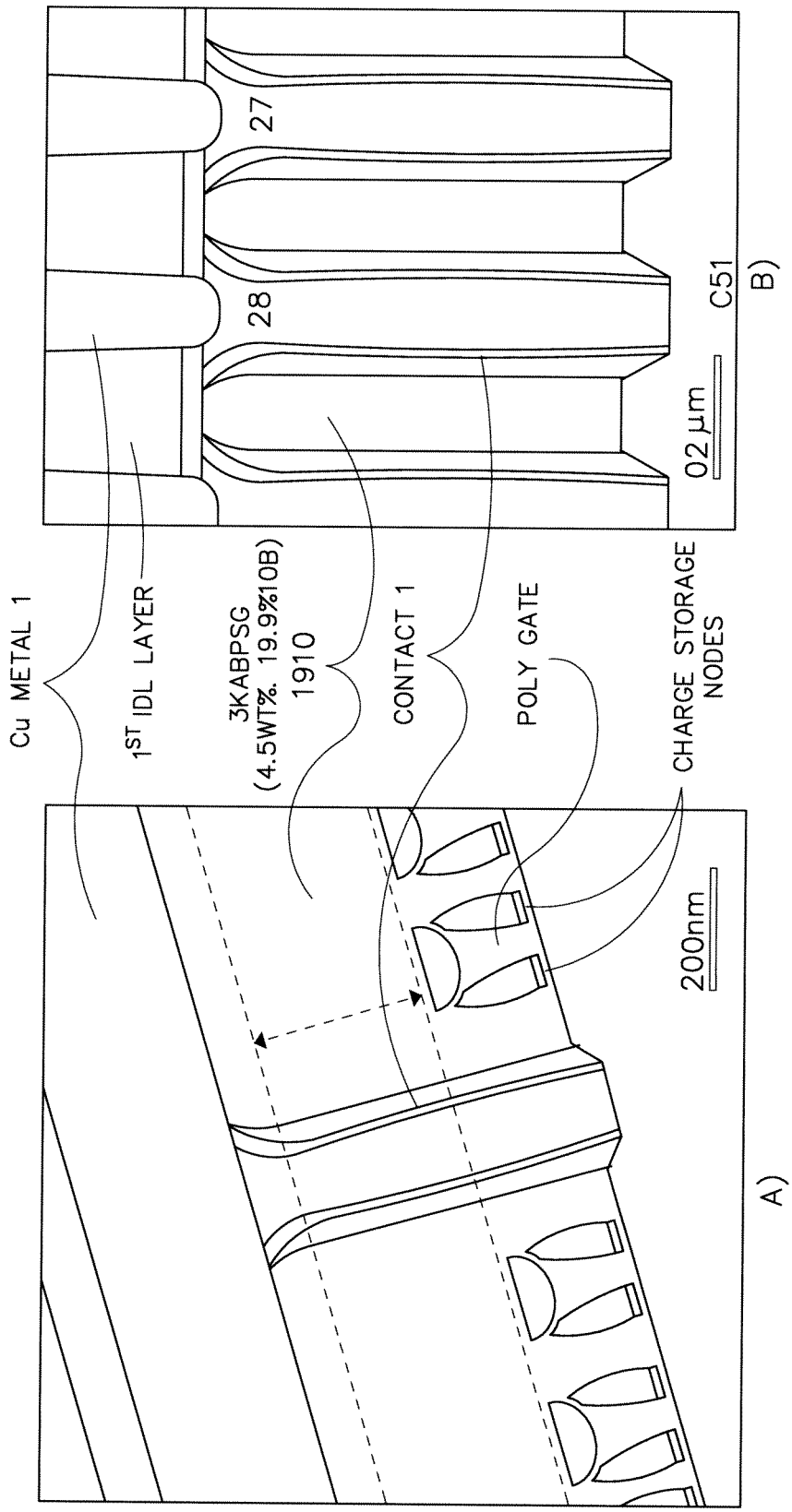
FIGS. 19A and 19B include cross-sectional views of a charge storage element in accordance with an exemplary embodiment.

An initial test of a neutron intercepting semiconductor ("NISC") device was performed using an off-the-shelf Spansion NS flash memory device with 90 nm lithographic design rules. The device measures 0.84 cm$^2$ in die area and incorporates 1 Gb memory capacity. Each memory cell within the die serves as a neutron detector. FIG. 19 is a transmission micrograph of a cross section of the core of the off-the-shelf mirror bit NS device based on 90 nm lithographic design rules. FIG. 19a shows a cross-section along the bit line direction and FIG. 19b shows a cross-section along the word line direction. Each device included 3 kilo-angstrom thick BPTEOS initial interlayer dielectric 1910 with a concentration of $^{10}B$ in the natural range, i.e. 19.9%. At this concentration, the film contained 6e16 #/cm$^2$ $^{10}B$ atoms, yet measured a thermal neutron detection efficiency of 0.014%.

The detector cell is connected to on-board voltage conditioners, sense amplifiers, and I/O buffers. These features allow specific trip limits to be set in the chip itself, eliminating the need for system elements typically found in existing analog neutron detectors, e.g., external pre-amplifiers, amplifiers, and discriminators. The data can be filtered by time, count and/or energy shift, and spatial position of detection event. The device can continue to read and store neutron detection events until actively reset, with or without external power.

Packaging includes a 56-pin Thin Small Outline Package (TSOP) industry-standard pin interface designed for direct integration into various application systems, e.g., cell phones.

Phase 0 devices, each containing a 3 kilo-angstrom thick BPTEOS ILD0 layer, were irradiated with either a $^{252}Cf$ or $^{137}Cs$ source to determine sensitivity to neutron as well as gamma radiation. One lot of the Phase 0 devices contained boron in a natural isotopic abundance (19.9% $^{10}B$, 80.1% $^{11}B$). A control lot contained mostly $^{11}B$. All devices were exposed in passive mode (i.e., no external power was used to operate the device during exposure). Prior to irradiation, the devices were programmed to place all cells in a (1, 1) state and the initial $V_t$ distribution was measured. After exposure, the devices were tested to determine the number of cells that had a shift in the $V_t$ distribution.

Figure 20:
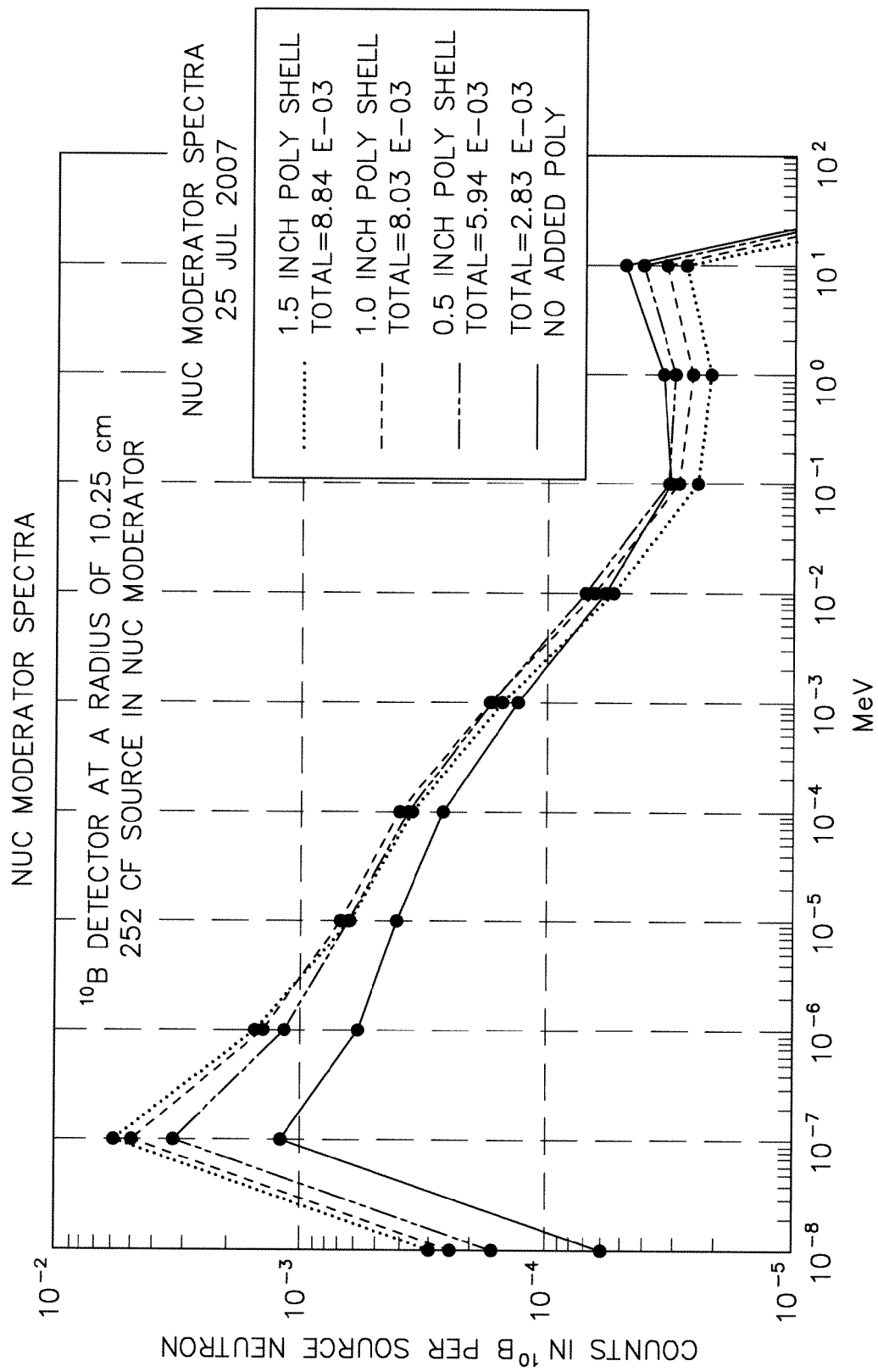
FIG. 20 shows the calculated neutron energy spectra in accordance with a test of an exemplary embodiment.

Neutron Flux Measurement and Exposure:

The $^{252}Cf$ source (source N, CF-291Z) was placed in a so-called NUC Moderator which was in turn placed in a 1-inch thick polyethylene shell to maximize the low energy part of the neutron spectrum. The NUC Moderator has 0.50-inch thick lead inner shell surrounded by a 0.75-inch thick polyethylene shell. This device was placed in the 1-inch thick polyethylene shell. The lead was intended to reduce the gammas emitted from the $^{252}Cf$ source. However, since the lead shield does not remove all gammas, this source is not a pure neutron source. MCNP, a Monte-Carlo type program, was used to estimate neutron flux emitted from the $^{252}Cf$ after passage through the lead and polyethylene moderators. FIG. 20 shows the calculated neutron energy spectra for a location on the equator of the cylindrical assembly. The thermal neutron detector in this case was $^{10}B$-based and indicated that the peak energy of the moderated neutron beam is close to the thermal neutron peak at 0.025 eV.

MCNP was also used to determine the interaction rate with the $^{10}B$ contained in the phase-0 prototypes. This program is commonly used to perform these types of flux estimates and is expected to yield reaction rates that are accurate to within approximately a factor of two. The phase-0 prototype detectors were irradiated for 95.17 hours at a distance of 10.95 cm from the $^{252}Cf$ source. The source emission rate was 6.15E6 neutrons at the midpoint of the exposure testing. The calculated neutron flux for the sources was between 1.32E2 to 4.4E2 n/cm$^2$/s.

The detectors irradiated with a $^{137}Cs$ gamma (662 keV) source did not receive any neutron exposure. The $^{137}Cs$ gamma source used had an exposure rate of 1.28 mrad per hour at 30 cm. The detectors were placed at 7 cm and irradiated for 15 hours, corresponding to 353 mrad, or about 3 times the yearly background.

Figure 21:
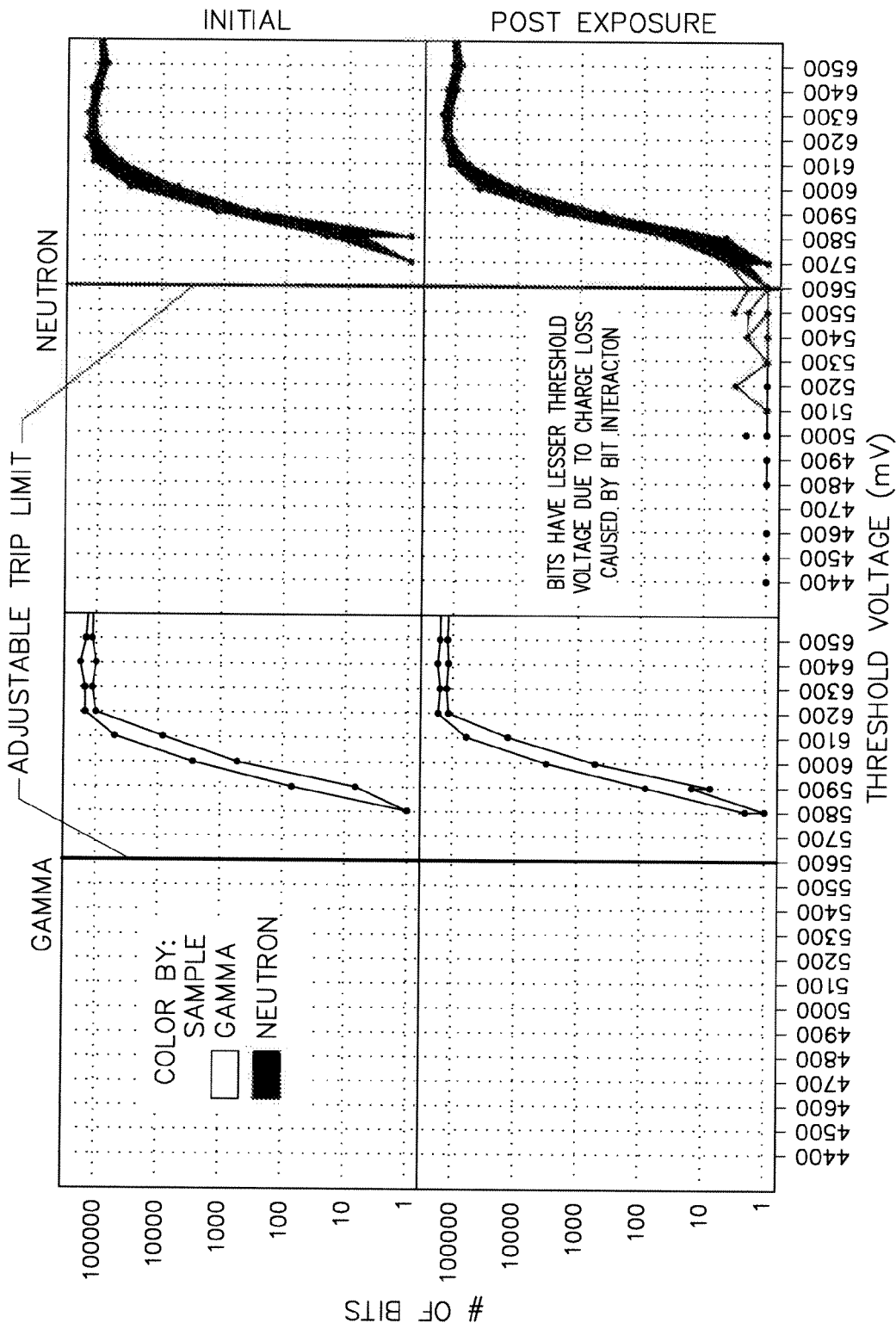
FIG. 21 shows measured changes in threshold voltage for charge storage elements or cells in accordance with a test of an exemplary embodiment.

Radiation Response of the Phase-0 Prototype NISC Devices:

Before exposing the detector, a $V_t$ bit map is created by measuring the $V_t$ of each cell in the detector. Once the detector is exposed, the $V_t$ is measured again for each cell to determine the distribution of $V_t$ shifts of individual cells. The $V_t$ distributions of the Phase 0 NISC devices containing natural $^{10}B$ isotope ratio (i.e., 19.9%) for both initial and post-irradiation from the $^{252}Cf$ neutron and the $^{137}Cs$ gamma sources are shown in FIG. 21. This data showed that a large number of cells had switched state from "0" to "1" when exposed to the $^{252}Cf$ neutron source. The data indicates that the exposed devices recorded an average of 10,000 events per device from interactions with the $^{10}B$ in the BPTEOS layer. These events were detected by individual cells, retained and recorded on the device. Furthermore, Phase 0 NISC devices fabricated with BPTEOS derived from isotopically-pure $^{11}B$ precursor (98%) showed little or no change in $V_t$ distribution when exposed to the same neutron dose (typically >100 recorded events). Moreover, all devices exposed to the $^{137}$Cs gamma sources showed no change in $V_t$ distribution regardless of BPTEOS film type. Conclusions that can be drawn from the data are that the detectors showed no sensitivity to gamma radiation and the $^{11}$B detector was not affected by the neutrons.

This experiment demonstrated that the $^{10}$B-containing BPTEOS film coupled with the nitride-based charge trapping layer in the device is an effective thermal neutron detector. Further analysis indicated the energy deposited into the underlying nitride-charge-storage layer by the $^4$He and $^7$Li fission fragments, on average, caused a shift of >300 mV in the $V_t$ of the effected cell. In the control sample, very few shifted cells were observed and are believed to arise from residual $^{10}$B (~2%) in the $^{11}$BPTEOS layer. The experiment also showed that the effect on $V_t$ distribution due the (n, α) reaction is large and demonstrated the validity of the principle behind the proposed detection method. The experiments also demonstrate that the cell design is highly efficient in detecting the fission fragments from captured thermal neutrons. To improve the detector efficiency, NISC devices can be manufactured with a substantially higher amount of $^{10}$B in close proximity to the charge trapping layer. As stated above, the Phase 0 NISC devices contained only 0.000001 g/cm$^2$ of $^{10}$B or 6E16 $^{10}$B/cm$^2$.

Features of the Memory Cell Technology to Increase the Performance Beyond that of an Off-The-Shelf NS Device, i.e., Phase 1 Memory Cell Features.

The amount of $^{10}$B in a single chip can be increased by: (1) using $^{10}$B chemical precursors to increase the amount of $^{10}$B in proportion to the amount of $^{10}$B; (2) changing the terminal via and ILD layers above ILD0 to a $^{10}$B-containing oxide; (3) increasing the percentage by weight of boron in the BPTEOS, for example from 4.5% to 7.2%; and (4) increasing the thickness of the ILD layers containing boron. These changes have the potential to increase the concentration of $^{10}$B atoms from the 6E16 n/cm$^2$ to ~3E18 n/cm$^2$ for a single die.

One way to enhance the detection efficiency of NS flash memory is to increase the number density of $^{10}$B atoms available for neutron capture. This can be done by depositing one or more BPTEOS layers using chemical precursors that have been isotopically enriched to contain a higher percentage $^{10}$B, thereby lowering the percentage of neutron-insensitive $^{11}$B. The chemical precursor for boron, enriched to about 98% $^{10}$B, is commercially available. An NS flash memory chip fabricated with 98% $^{10}$B will not behave chemically or electrically different from a conventional chip since there is no known isotope effect on the device characteristics. There will, however, be an improved neutron capture efficiency.

In another approach, increasing the concentration of boron (assuming a fixed ratio of $^{10}$B to $^{11}$B) in a BPTEOS film will have a similar and additive effect as changing the isotope ratio. BPTEOS film stability can be maintained to about 7.5% weight boron doping, as determined by experimentation. Also, increasing the thickness of the BPTEOS layer or changing interconnect layers that currently use un-doped silicon oxide films to BPTEOS will increase the neutron capture efficiency.

Figure 22:
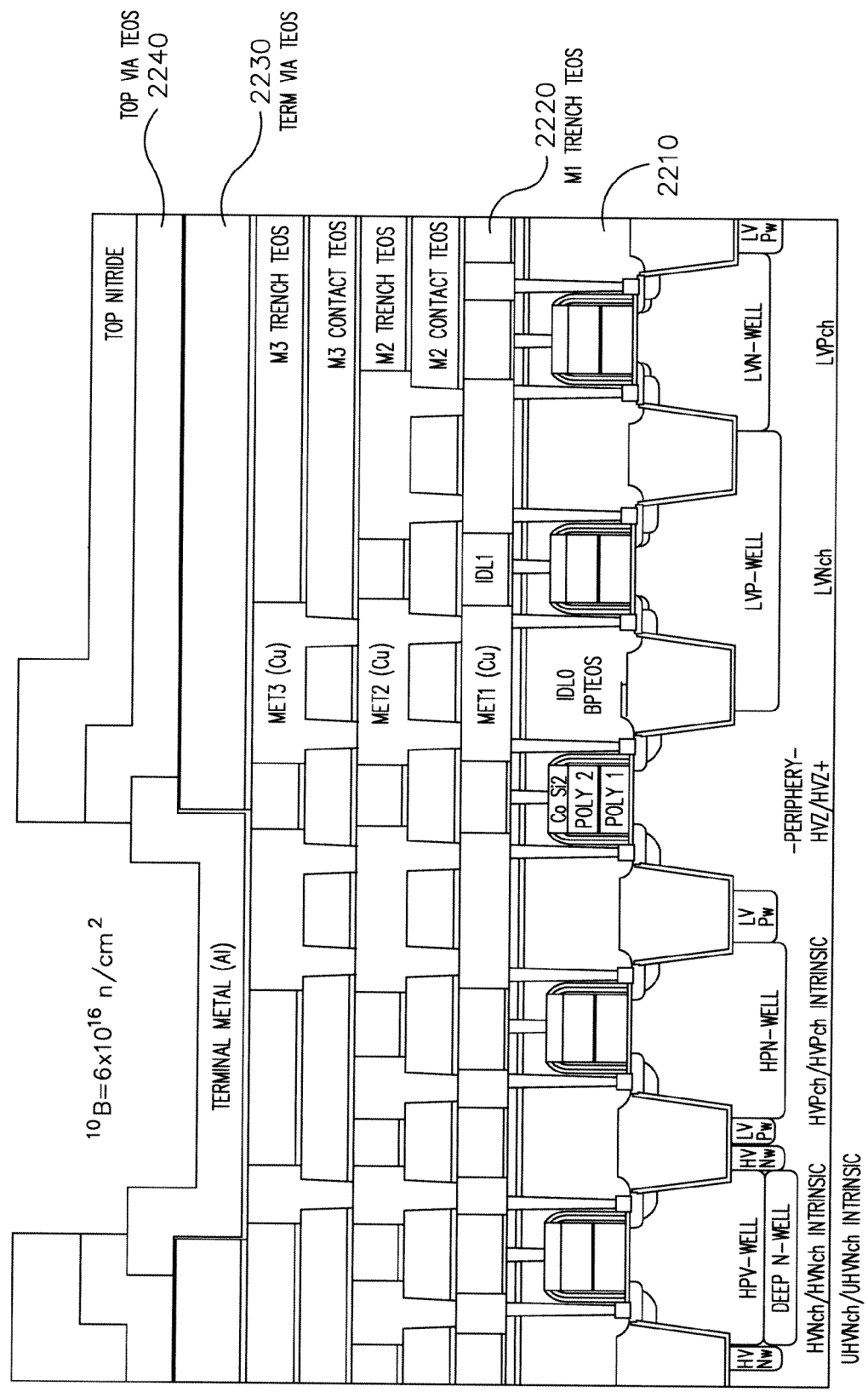
FIG. 22 includes a cross-sectional illustration of a 90 nanometer nitride storage detector device.

FIG. 22 is a cross section diagram of a 90 nm NS device showing where the number of $^{10}$B atoms available for capture can be increased over the number available in a conventional NS flash memory cell. For example, one can convert the 1st metal inter-layer dielectric (ILD1) 2220 from un-doped oxide to BPTEOS, and convert the terminal via (TV) ILD 2230 and topside (TS) ILD 2240 from un-doped oxide to BPTEOS. Furthermore, $^{10}$BPTEOS can be placed at different distances from the charge trapping node, e.g., contact inter-layer dielectric 0 (ILD0) 2210, first metal ILD1 2220, terminal via oxide 2230 and top side oxide 2240. In some embodiments of the technology, placement of the BPTEOS or $^{10}$BPTEOS films in the upper layers of a device is balanced to account for effects of the finite range of the reaction fragments.

Figure 23:
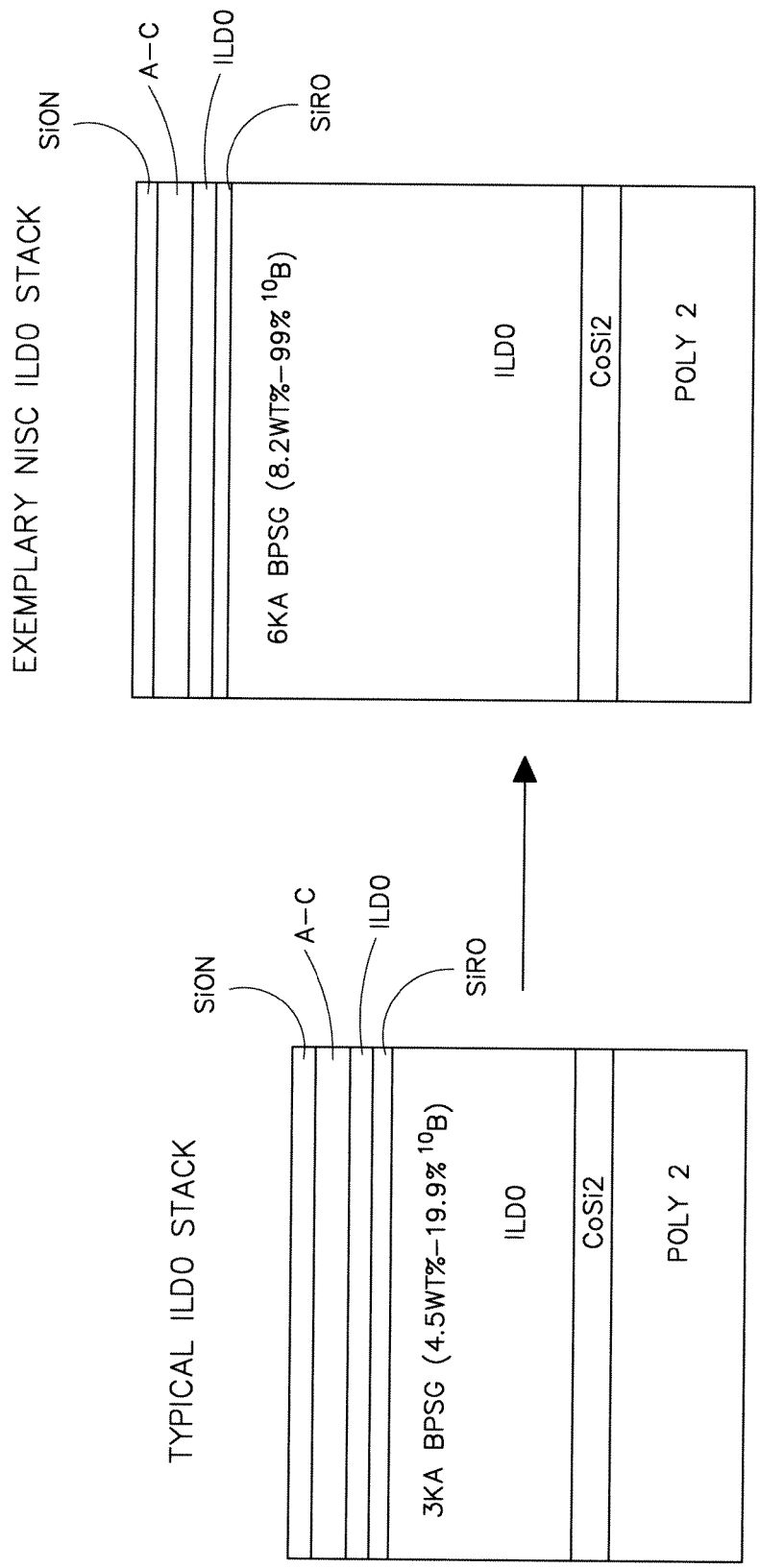
FIG. 23 shows cross-sectional illustrations of a charge storage element in accordance with an exemplary embodiment.

By depositing a BPTEOS layer using chemical precursors that have been isotopically enriched to contain mostly, if not only, the $^{10}$B isotope, thereby reducing or mostly eliminating the insensitive $^{11}$B isotope, we increase the $^{10}$B concentration by a factor of about 5×. As mentioned previously, increasing the boron concentration in the BPTEOS film will have an effect similar and additive to changing the isotope ratio. However, the boron/phosphorous doping of the glass plays a role in hydrogen gettering, which is particularly important for the ILD0 layer. By incorporating this BPSG film into the ILD0 film stack, we further increase the $^{10}$B concentration. Furthermore, the ILD0 BPTEOS film thickness itself can be increased, since the typical contact formation process (contact etch, barrier metal deposition, tungsten fill, and tungsten polish) can support a thick ILD0 layer, particularly if only the BPTEOS layer thickness is increased. FIG. 23 illustrates an exemplary embodiment where the thickness of the ILD0 layer can be increased from 3.0 KÅ up to 6.0 KÅ and the concentration of the $^{10}$B isotope is increased. Together these changes can increase the overall $^{10}$B concentration substantially.

Figure 24:
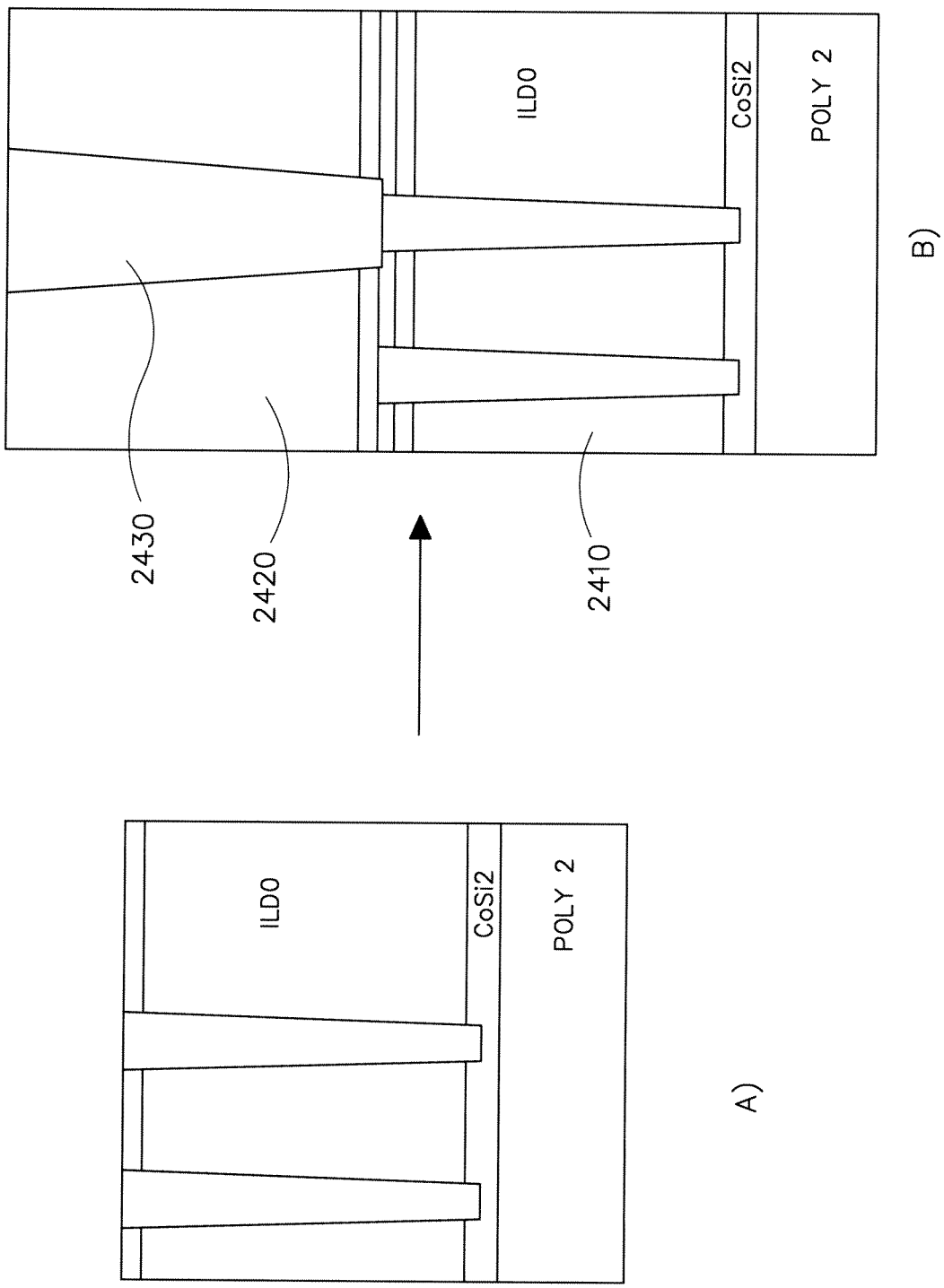
FIG. 24 shows cross-sectional illustrations of a charge storage element in accordance with an exemplary embodiment.

Referring to FIG. 24, the ILD1 interconnect layer 2420 immediately above the ILD0 layer 2410 is used for routing the first copper metal. The 3KÅ of undoped TEOS oxide that currently forms ILD1 layer can be replaced with 3.5KÅ BPTEOS (7.5 WT % $^{10}$B). However, since the first metal copper routing, e.g., 2430, is etched into this film, only about 60% of the film remains as part of the finished device. This results in about 2.1KÅ of BPTEOS (7.5 WT % $^{10}$B).

Combined with the changes to ILD0 layer, the effective thickness of BPTEOS will increase from 3KÅ to 8.1KÅ which will increase the net $^{10}$B concentration by a factor of 22.5×. Neutrons that are not captured by the BPTEOS films in the chip are likely to pass through the remainder of the chip, including the bulk of silicon from which the chip is fabricated. Therefore, the net neutron capture efficiency can be increased by stacking individual NISC chips on top of each other. This is precisely what happens to die in Multi-Chip Packages (MCPs).

Figure 25:
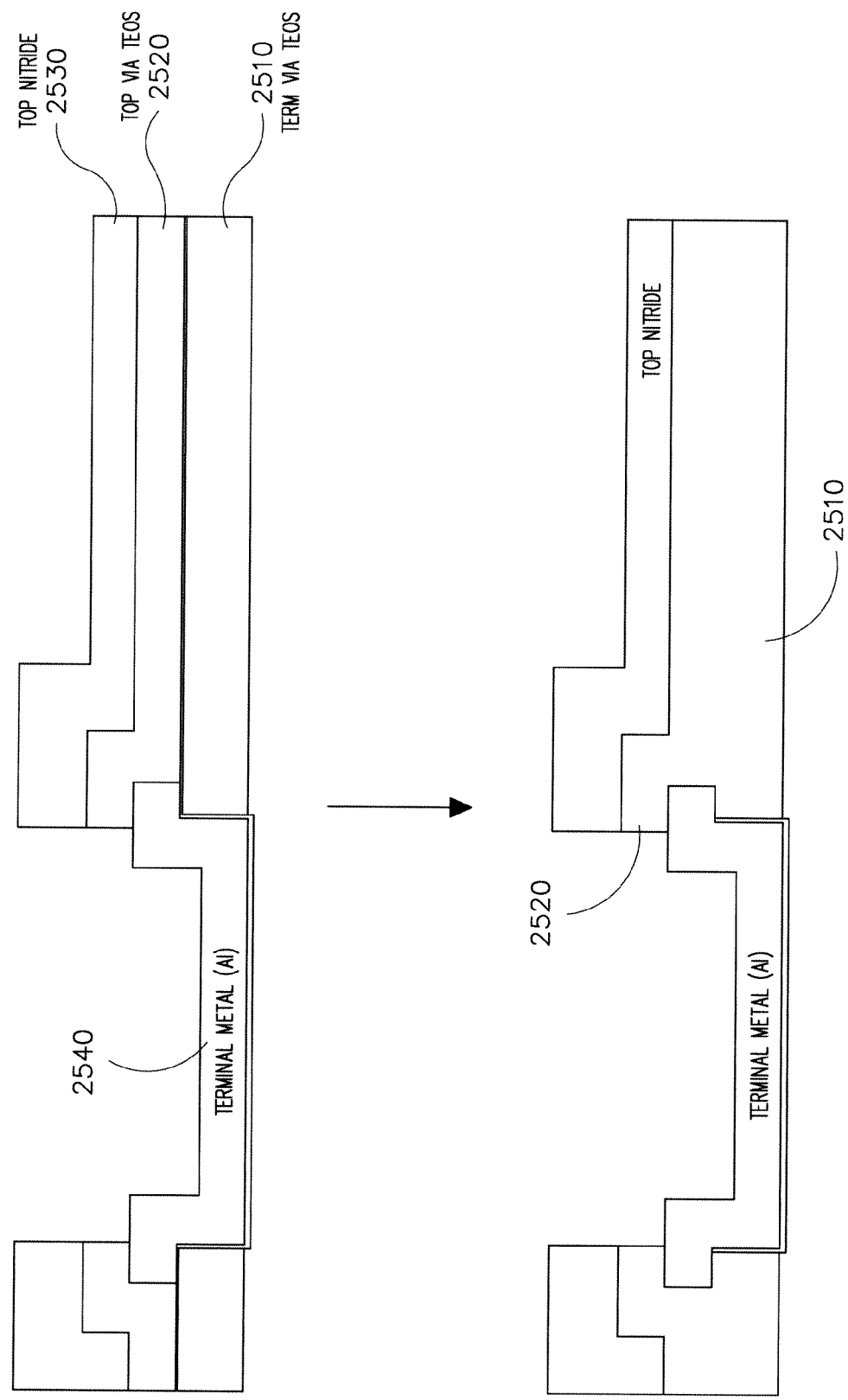
FIG. 25 shows cross-sectional illustrations of a charge storage element in accordance with an exemplary embodiment.

Referring to FIG. 25, the final dielectric layers on the device are the terminal via (TV) stack 2510, the topside (TS) TEOS (SiO$_2$) underlayer 2520 and the topside nitride layer 2530. The TV dielectric 2510 isolates the third copper interconnect layer from the terminal Al metal layer (TM) 2540 that is used for power bussing and bond pad formation. Large (1 micron) vias are etched in the TV stack 2510 to connect the TM 2540 to the third copper interconnect. After the TM 2540 is patterned, the TS TEOS 2520 and TS nitride 2530 are deposited and openings to the bond pads are etched into this layer. The TS dielectric stack serves to isolate the die from the environment by hermetically sealing the die except where the bond pads are opened. Wire bonding to the bond pads is used to connect the die to the device package.

The TV 2510 and TS underlayer oxide layer 2520 also can be engineered to increase the $^{10}$B concentration in the die. For example, as illustrated in FIG. 25, the existing 5.5KÅ and 5.0KÅ of un-doped TEOS oxide that currently forms the TV 2510 and TS 2520 layers, respectively, can be replaced with an equivalent thickness BPTEOS (7.5 WT % $^{10}$B) layers 2510' and 2520'. Combined with the changes to the ILD0/1 layers above, the physical thickness of BPTEOS will increase from 3KÅ to 18.6KÅ, which will increase the net $^{10}$B concentration by a factor of 51.7×.

Another method of increasing the detection efficiency is to increase the density of charge trapping cells per unit area in the memory array. As memory technologies scale from one technology node to the next, the number and density of charge trapping cells per unit area typically doubles. This will increase the probability that a fission fragment will traverse through a charge trapping cell and be subsequently detected and is independent of the $^{10}$B concentration.

Figure 27:
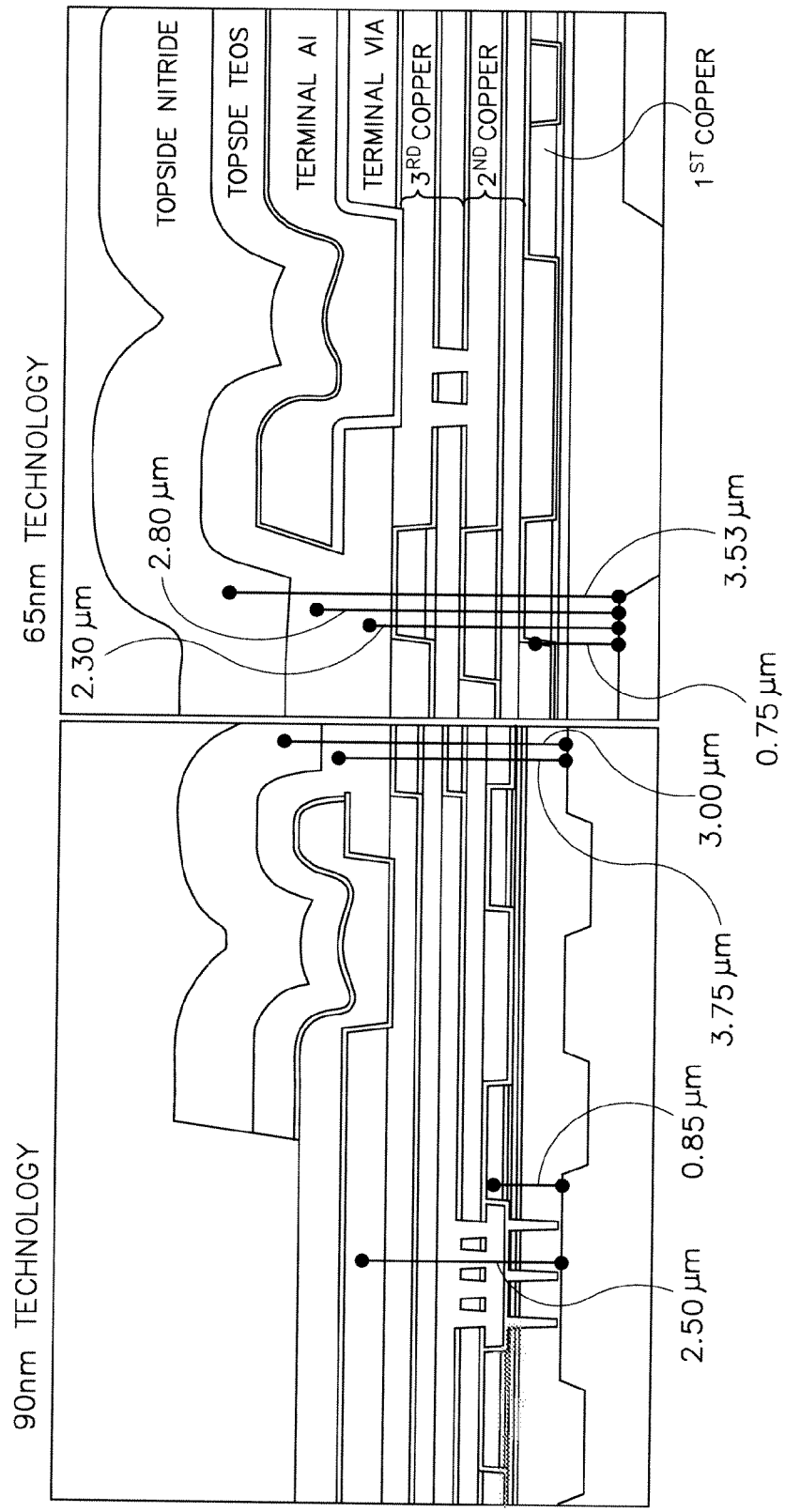
FIG. 27 shows cross-sectional images of charge storage elements in accordance with an exemplary embodiment.

The above methods increase the detector efficiency by increasing the number or density of $^{10}$B atoms available for neutron capture. However, to record the neutron capture event in the memory cells of the chip, the device requires that the trajectory of one of the fission fragments pass through one of the charge storage regions of the memory cell. The penetration range of an energetic ion is dependent on its mass and kinetic energy and also on the material that it is passing through. The higher the atomic mass of the nuclei of the material, the shorter the range the ion will travel.

stacks used for both the 90 nm and 65 nm devices is shown in FIG. 27 (the SEM micrographs are not at the same magnification). Since the 65 nm node incorporated some degree of vertical scaling in the interconnect layers, the distance of the target layers for the phase-1 NISC devices in less than that for 90 nm phase-0 NISC devices.

Figure 28:
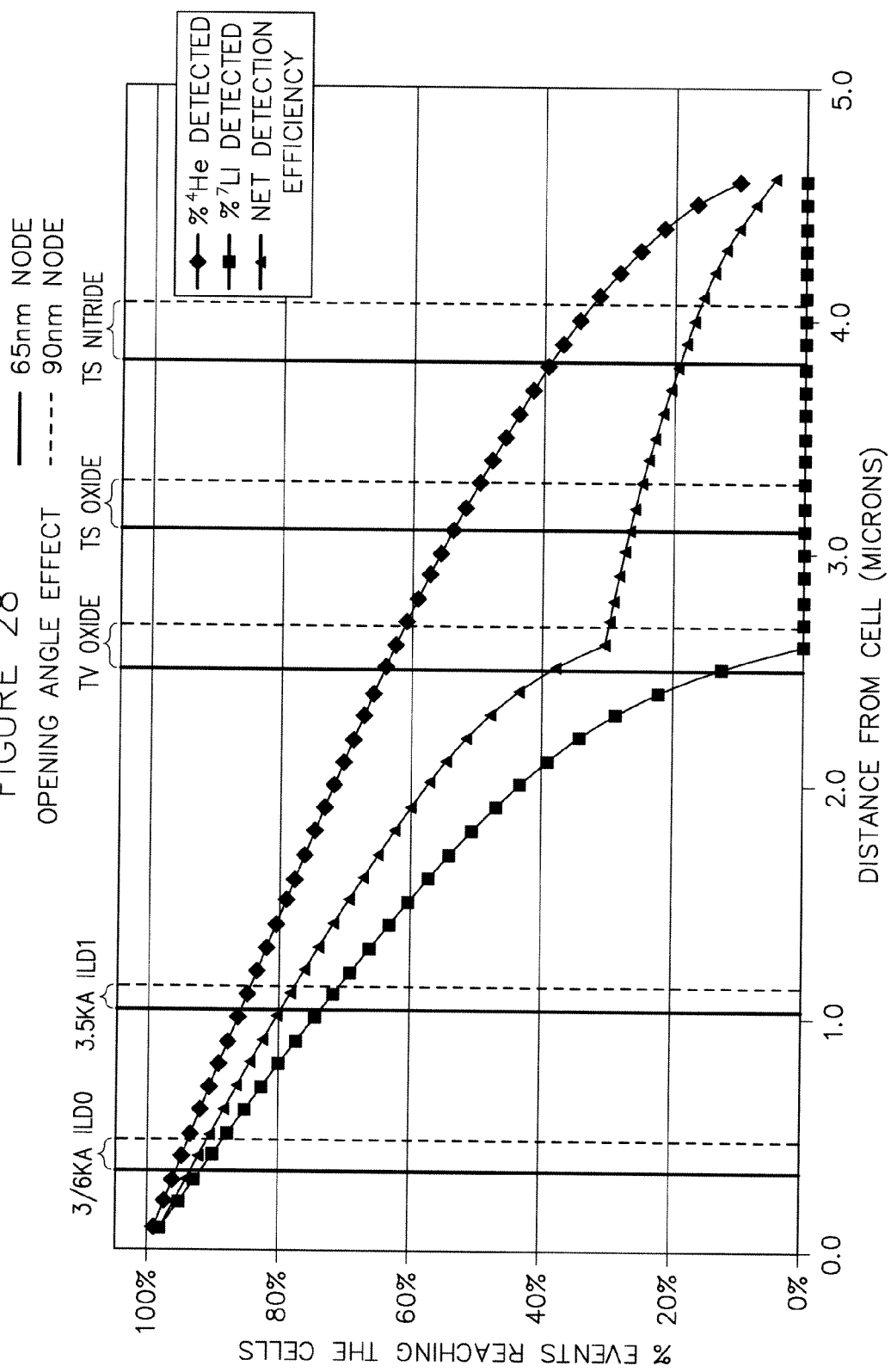
FIG. 28 shows probabilities of detecting an ion in accordance with an exemplary embodiment.

Due to the back-to-back trajectories of the ions, the total detection probability is the average of the individual probabilities for the $^4$He and $^7$Li ions. These probability functions for $^4$He and $^7$Li as well as the total probability are shown in FIG. 28 and Table 4 below. In FIG. 28, the vertical lines mark the distance from the memory cell to the dielectric layers considered for $^{10}$B loading for the devices. These calculations do not take into account that fission fragments in the upper dielectric layers must pass through three copper and one aluminum metal interconnect. Therefore, these probabilities are a best-case estimate.

TABLE 4

| Technology Node | Vertical distance from the memory array (µm) | | % $^4$He detected | | % $^7$Li detected | | Net Detection Probability | |
|---|---|---|---|---|---|---|---|---|
| | 90 nm | 65 nm | 90 nm | 65 nm | 90 nm | 65 nm | 90 nm | 65 nm |
| ILD0 Phase-0 | 0.33 | 0.33 | 95.5% | 95.5% | 91.7% | 91.7% | 93.6% | 93.6% |
| ILD0 Phase-1 | 0.48 | 0.48 | 93.4% | 93.4% | 87.9% | 87.9% | 90.7% | 90.7% |
| ILD1 Phase-1 | 0.85 | 0.75 | 88.3% | 89.7% | 78.4% | 81.0% | 83.3% | 82.3% |
| Terminl Via | 2.50 | 2.30 | 64.0% | 67.1% | 12.6% | 28.4% | 38.3% | 47.8% |
| Topside TEOS | 3.00 | 2.80 | 55.5% | 59.0% | 0.0% | 0.0% | 27.7% | 29.5% |
| Topside Nitride | 3.75 | 3.53 | 40.5% | 45.3% | 0.0% | 0.0% | 20.2% | 22.6% |

Figure 26:
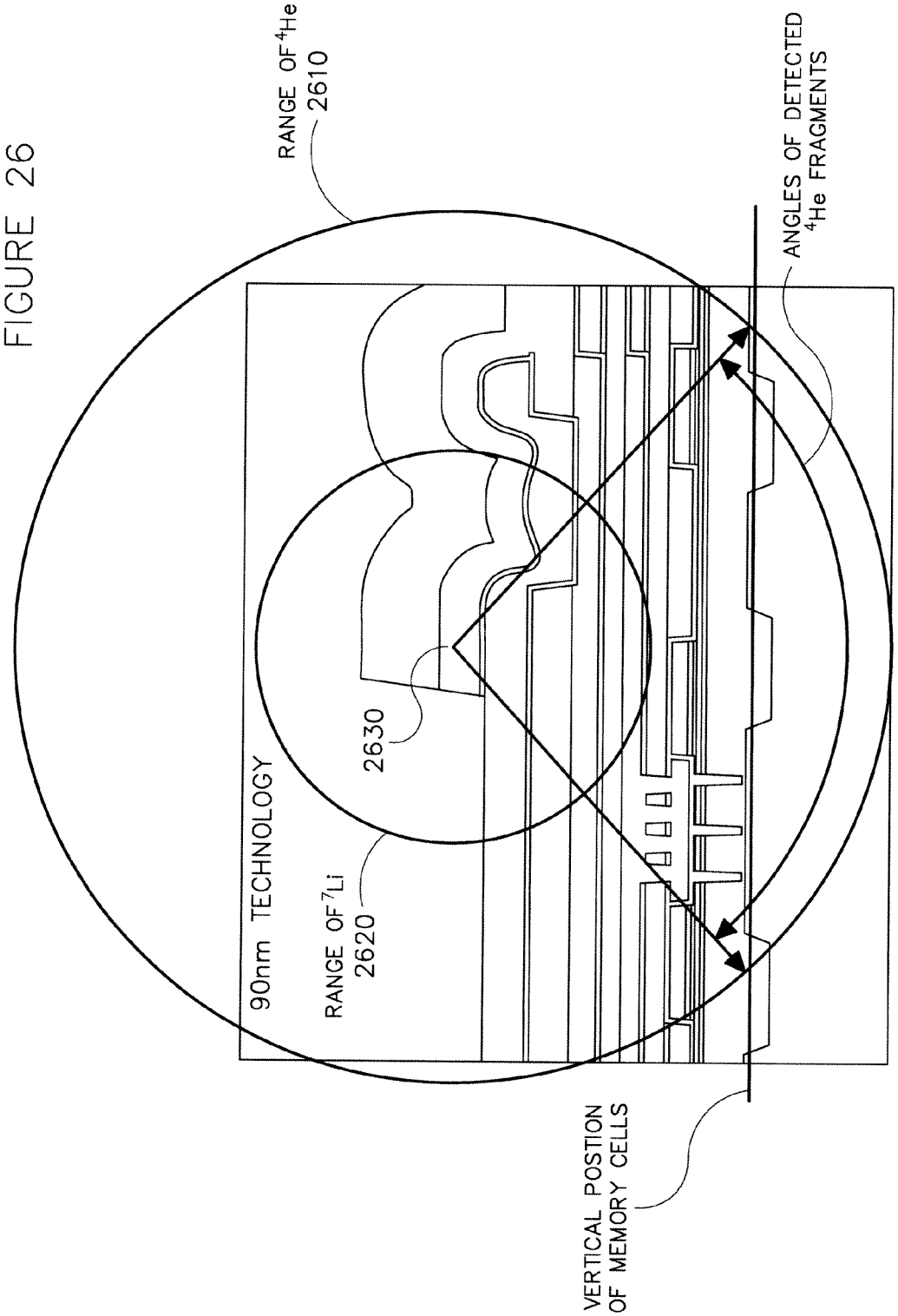
FIG. 26 shows a cross-sectional image of a charge storage element in accordance with an exemplary embodiment.

Using standard ion implantation software, we calculate the range of the 1.43 MeV $^4$He particle to be 4.66 µm in SiO2 and 2.70 µm in Cu. For the 0.84 MeV $^7$Li ion, the ranges in SiO$_2$ and Cu are 2.55 µm and 1.35 µm, respectively. The trajectories of fission fragments are random and fill all solid angles, and the $^4$He and $^7$Li ions travel in opposite directions. Therefore, there is equal probability that the fission fragment that travels toward the memory cells is the $^4$He ion or the $^7$Li ion. The distance between the memory cells and the position of a given $^{10}$B-containing layer in the device is a strong factor in determining the probability of whether or not fission events in that layer will be recorded. This effect is illustrated in FIG. 26. The Scanning Electron Microscope (SEM) image shows the cross section of the full die used in the 90 nm-based phase-0 NISC device. The outer 2610 and inner 2620 circles show the penetration distance of the $^4$He and $^7$Li ions (assuming penetration through SiO$_2$) for a hypothetical $^{10}$B fission event in a TS 2630 $^{10}$BPTEOS film. Geometrically, we see in this example that none of the $^7$Li ions and only a fraction of the $^4$He ions reach the memory cells from this event. Therefore, even though the neutron was captured by the device, it has a low probability of being recorded by the memory array. Although not visible in the SEM image in FIG. 26, the vertical position of the memory cells in the chip is shown. The memory cells would be visible if the cross-section was taken at a deeper position in the chip.

Due to the cylindrical symmetry of this configuration, it readily can be shown that the detection probability is proportional to the opening angle of trajectories of the fragments that reach the memory cells. These angles are determined geometrically from the vertical distances of the various layers containing $^{10}$B. The vertical distance between the memory cells and the various layers comprising the interconnect From this analysis we conclude that placement of the $^{10}$B-containing films in the upper layers of the device has diminishing returns because the fission events are unlikely to be detected.

While increasing the density of $^{10}$B atoms available for neutron capture will have benefits to device efficiency, the effects of finite fission fragment range can limit the effectiveness of this approach. Another independent method of increasing the detection efficiency is to increase the inherent cell detection efficiency. The analysis of the phase-0 prototype data indicated that the cell detection efficiency was ~60%. For this device, the center of the $^{10}$B-containing BPTEOS ILD0 layer was only 0.33 µm above the memory array. The opening angle calculation for this layer (see Table 4 above) predicts that 93.6% of the fission event in this layer produced fragments that should have passed through the memory array. Therefore, 37.5% of the fission events that should have been detected were not detected. The charge trapping areas are quite compact and only partially fill the full area of the array. By packing the charge trapping nodes closer together we should increase the likelihood that an interaction will occur.

Fortunately, as memory technologies scale from one technology node to the next, the density of charge trapping cells per unit area typically doubles. This doubling will increase the probability that, if a fission fragment traverses through the layer of charge trapping cells, it will cause a state change in the memory cell and be subsequently detected. This method of detection enhancement is independent of the $^{10}$B concentration. Furthermore, as the technology node shrinks, the number of trapped electrons in each cell also decreases since the threshold voltage of the cells is constant. Therefore, each electron removed from the more densely packed charge trapping cells reduces the memory cell $V_t$ by a proportionally larger amount.

Figure 29:
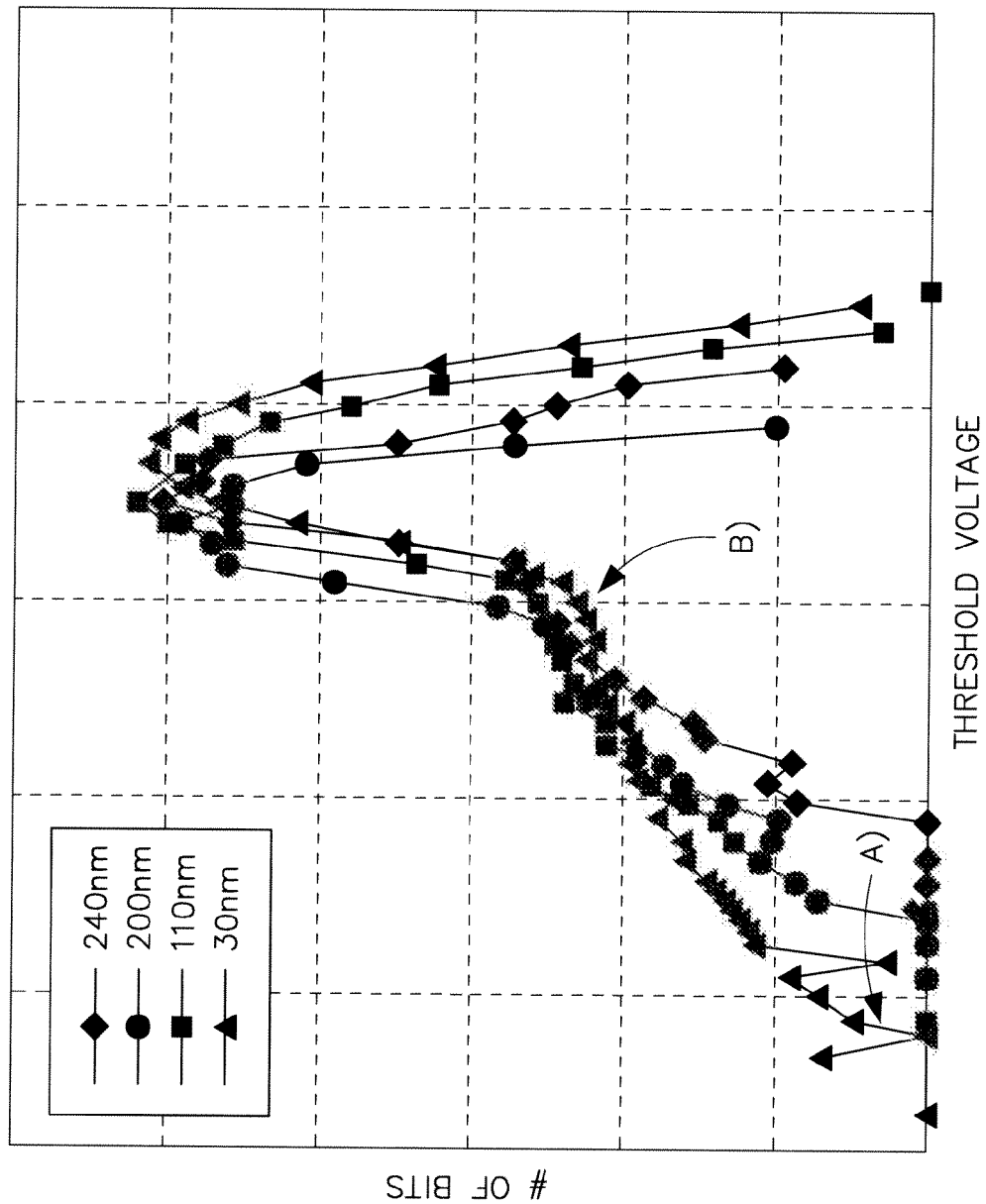
FIG. 29 shows changes in threshold voltage for four nitride-storage flash memory devices in accordance with exemplary embodiments.

FIG. 29 shows the changes in $V_t$ for four successive nitride-storage flash memory devices by direct exposure/fixed dose of a high-energy $^4$He beam (6.2 MeV), which was sufficient to penetrate the entire interconnect stack for each device. These devices all included the same 3.0KÅ thick ILD0 BPTEOS layer (19.9% $^{10}$B; 80.1% $^{11}$B). The graph illustrates several points. First, not only are nitride-storage-based flash die able to detect neutrons, they are also sensitive to direct $^4$He fragments if the particles have sufficient energy. Therefore, a die fabricated with $^{11}$BPTEOS would be immune to both gamma and neutron radiation, but remain sensitive to high-energy $^4$He particles which could have application as a radon detector. Second, as density of charge trapping cells increases from node to node, the number of cells disrupted for a given dose increases. This is indicated by arrow a) showing the increased number of cells outside the main distribution for each successive node. Third, range in magnitudes of the $V_t$ shifts of the disturb cells becomes tighter and at a higher absolute value. This is indicated by arrow b), showing that the number of bits shifted by a small amount decreases node to node. The data indicates an increase in inherent cell detection efficiency for the 65 nm phase 1 prototype over that of the 90 nm phase 0 prototype.

Beyond $^{10}$B loading and charge-storage cell packing, further efficiency enhancements are possible. Outside of $^{10}$B, very few nuclei in the remainder of the die or in the package will likely absorb many thermal neutrons. Therefore, neutrons which are not captured by the BPTEOS films in the chip are likely to pass through the remainder of the chip, including the bulk of the silicon from which the chip is fabricated. This implies that the net neutron capture and detection efficiency can be increased by stacking individual NISC chips on top of each other to form a composite detector. This arrangement is precisely what happens to die in multi-chip packages (MCPs). Spansion currently markets flash products incorporated as many as nine stacked die with capability of extension to 12-die stacks and Package-On-Package configurations that could boost the number of dies to 24. By measuring the $V_t$-shifted cell counts for all the packages in the stack and summing them, we can estimate the detection efficiency of an equivalent number of die stacked in an MCP. The additive detection efficiency is not strictly linear with the number of chips stacked since the chip above attenuates the neutron flux for the chips below. The efficiency enhancement is nevertheless quite substantial. The stacking of die into MCPs can also help overcome the limitations on $^{10}$B loading due to the finite range effect of the fission fragments. In the MCP arrangement, we are effectively sandwiching layers of neutron absorber and fragment detectors. It is not necessary to pack each die with more $^{10}$B than is optimal to maximize fragment detection of all neutrons captured since more $^{10}$B is waiting in the chip below to capture what is missed.

We have projected that a $^{10}$B loading of 1-3E18/cm$^2$ is achievable in this work and that this number might be effectively increased to 6-9E18/cm$^2$ with future enhancements. Nevertheless, there are a finite number of $^{10}$B atoms in each chip which will decrease over time proportional to the total neutron dose. This depletion process affects all neutron detectors reliant upon neutron mediated fission for detection, including $^3$He-gas-based-tube detectors that require periodic recharge of the $^3$He supply. For the NISC there is no method for replenishing the $^{10}$B in the NISC after it has been consumed by neutron captures. This depletion effect implies that the detection efficiency of a die will decrease as a function of total neutron dose and sets a finite lifetime for each die. However, stacking sufficient numbers of NISC die in MCPs will also moderate this depletion effect since dies lower in the stacks will deplete at a slower rate than those die higher up. Thus, the total detection efficiency of an MCP stack will degrade proportionally slower than that of a single die. Furthermore, since the NISC is digital, the total dose can easily be recorded, such as into an $^{11}$B based flash memory chip, each time it is read. Once a pre-determined total cumulative dose is reach, the NISC MCP (or circuit board holding an array of NISC MCPs) can simply be removed from its standard IC socket (or board) mounting and replaced with a fresh NISC unit (or board). This could potentially be done in the field.

Process for Fabricating

Conventional processes for manufacturing nitride storage flash memory chips can be employed to manufacture the neutron detecting devices described herein. However, to improve the performance of the detector devices, boron concentrations and film thicknesses, and memory cell densities can be adjusted as described above.

Controller and Other On-Chip Elements

In the preferred embodiment, a solid state detector element, in the form of a non-volatile cell array, directly connected to on-board voltage conditioners, sense amplifiers, and I/O buffers allows specific trip limits to be set within the chip itself, eliminating the need for external preamplifiers, amplifiers, discriminators, etc. The data can be filtered by time, count and/or energy shift, and spatial position of the detection. Typically, a die-level controller uses microcode to allow reprogramming of the dies without physically changing the die. For example, the die-level controller allows adjustment of various parameters to map certain sectors of the die and to control the $V_t$ measurements.

In an exemplary embodiment of the detector, an on-board controller, e.g., an 8051 microcontroller, allows for customization and flexibility of the device's internal code to fit applications such as using the device in passive mode versus using the device in a real-time application. The controller also allows for read and discrimination to occur on-board, reducing the read time and power consumption because there is no need for circuitry to drive the data to an external bus, e.g., for comparison or analysis. The controller provides the opportunity for adjustable sampling areas for faster response time and/or higher resolution. Using the on-board controller, a device can be configured as either a master or a slave.

An exemplary embodiment of the detector can comprise an adjustable internal current reference which provides for adjustable discrimination and reduced need for off-board components. Each device can be uniquely identifiable with information stored during manufacturing. Attempts to tamper with the device can be detectable. The integrated architecture allows for time stamping of events and evaluation of interaction location for signature analysis and for imaging. In the event there is a problem with part of an array of the devices, problem areas can be mapped out from additional interrogation to allow the device to continue to operate.

Phase 1 (65 nm) Design Elements Beyond Memory Cell Construction

In one exemplary embodiment, the Phase 1 (e.g., 65 nm) design provides double the area density of charge trapping nodes on each chip. This embodiment can have an on-board 8051 microcontroller and chip ID/security features. The microcontroller allows for customization and flexibility of the device's internal code to fit applications such as using the device in passive mode versus using the device in a real-time application such as an NISC detector in a mobile telephone. The microcontroller allows for reading and discrimination to occur on-board, reducing the read time and power consumption, at least because there is no need for circuitry to drive the data to an external bus for comparison or analysis. Sampling areas can be adjusted for faster response times and/or controlled resolution using the on-board microcontroller. This device can be micro-controller configured as either a master or a slave—meaning it can operate as a stand-alone device or in conjunction with a larger system. An integrated watch dog timer conserves power and allows for set-up of automated monitoring or adjustable polling rate. The industry-standard footprint and Serial Peripheral Interface (SPI) allow for integration into existing systems. Adjustable discrimination can be implemented through an adjustable internal current reference. Each device can be made uniquely identifiable with information stored during manufacturing. The detector device can be designed so that attempts to tamper with the device are detectable and require a complete reset of the device, typically by qualified personnel. In the event there is an issue with part of a detector array, the affected area can be mapped out from additional interrogation to allow the device to continue operation. For example, the affected area can be mapped out at the sector level of an individual die, at a die level or at an MCP level.

Features and Advantages of NISC Detectors

False Alarm Rate

One advantage of the NISC device is insensitivity to gamma radiation. This feature is an advantage in filtering out signals from non-SNM (e.g., bananas, cat litter, ceramic tile) that generate false positives in conventional devices.

Detector Efficiency

Thermal neutron detection efficiency, is the ratio of the measured neutron flux to the neutron flux known to be passing through the device. Detector efficiency is, at least in part, a function of the distance between the NRM and the charge trapping area(s). However, one method of increasing efficiency is by stacking NISC chips on top of each other creating multiple opportunities for a neutron to collide with $^{10}$B.

Detector Sensitivity

The NISC detector offers much greater sensitivity than conventional detectors. For example, a conventional diode detector has sensitivity on the order of 300V. In contrast, as shown in FIG. 21, the NISC device offers sensitivity to measurements on the order of approximately 300 mV.

Form Factor

Although not required, the preferred embodiment of the NISC detector uses 65 nm integrated circuit technology node packaged in 56-pin Thin Small Outline Package (TSOP). The NISC chips can be packaged in multichip packages (MCPs) which can be placed in varying arrangements and stacks. Other technology nodes such 90 nm and 45 nm technology can also be used.

NISC detectors can function in a variety of conditions including in temperature ranges of −25 C to 90 C and, depending on the application, require little or no power.

Integration

The NISC detectors can be easily integrated with other equipment. All components of the basic system, e.g., voltage control, signal conditioning, sense amplifiers, I/O buffer, can be solid state on a single chip. Even an application-specific microcontroller, chip ID, and tamper protection can be integrated into the current 65 nm form factor.

Scalable at the Device Level

Large area arrays can be constructed for increasing effective range and sensitivity, and enabling imaging applications. For example, an array of NISC detectors can provide information about the location of the neutron source.

Manufacturing

The NISC detector can be produced in scalable, high-volume manufacturing flow for economies of scale.

Digital

Digital operation of the NISC detector facilitates eliminating off-board processing elements found in typical neutron detectors, and promotes integration into computing and communication devices.

Non-Volatile and Reusable

In applications where a NISC device is not exposed to constant flux over a long period of time, the likelihood of a neutron interacting with the same cell twice is phenomenally low, allowing passive detection data retention on the order of magnitude of at least ten (10) years.

Adjustable Mapping Capability and Fast Parallel Reads—Increased Resolution or Faster Speed The ability to track individual bit locations across the memory array allows individualized $V_t$ shift and allows mapping out of bad individual cells. The ability to map out bad sectors is standard in 65 nm node technology.

While the devices and methods herein describe neutron detection, the same principles can be applied to detect other charged particles or particles that will create or emit charged particles and disrupt the memory cells in the charge trapping layer of the nitride storage cell.

Systems for Detecting Neutrons

System-Level Architecture Features

Stacking and Arrays

In another exemplary embodiment of the detector device, stacking individual die into multichip packages (MCPs) will enhance neutron capture efficiency. Feasibility studies point to efficiencies as high as 80%-90%. MCP arrays can be placed back-to-back on PC boards and the PC boards can also be stacked to increase efficiency to a desired level. Silicon via technology can be used to stack even more die if required for the application. Silicon via technology eliminates the need for bonding pads to interconnect die.

Figure 31B:
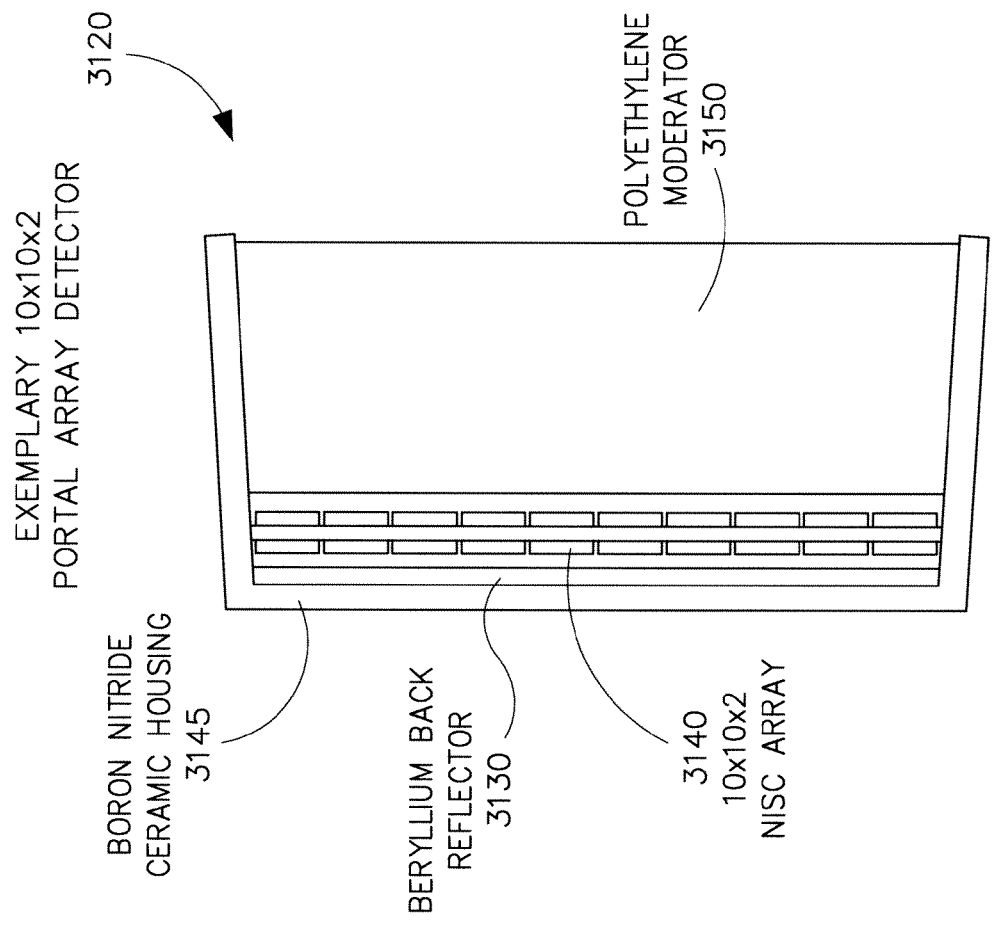
FIG. 31B shows a detector device implemented with an array of multi-chip packages in accordance with an exemplary embodiment.

In addition to stacking dies and boards of dies, the detectors can comprise arrays of multiple boards side by side. A single NISC MCP detector is about 1 cm$^2$. Small arrays of NISC can be formed by tiling NISC MCPS on both sides of a circuit board. As illustrated in FIG. 31B, an exemplary portal detector 3120 includes a 10×10×2 NISC MCP array 3140, an aluminum case with BN flame sprayed ceramic 3145 (for cosmic ray background suppression), a Beryllium back reflector 3130 (about 0.25" thick), and a high-density polyethylene moderator 3150 (to slow the neutrons). The basic array configuration is scalable to a large area (>1 m×1 m).

Directional Features

Shields, reflectors and collimators can be used in varying arrangements to reduce noise or to shield off-angle neutrons.

Moderator—e.g., High-Density Polyethylene

The architecture of a basic NISC device responds to thermal neutrons. To increase the likelihood that a NISC device would respond to fast neutrons, a moderator, e.g., hydrogenous material such as polyethylene, can be used. FIGS. 30 and 31B illustrate exemplary detectors using polyethylene moderators to slow some portion of any fast neutrons passing through the moderator to thermal neutron speed/energy.

Powering Options

No external power is required and internal battery sources are needed only for data retrieval, e.g., through RFID tags or wireless communication.

System-Level Controller

The system-level controller is typically located on the system-level board that the array is mounted on. The system-level controller interfaces with the die or MCP and communicates with off-board processing components. However, in other embodiments, such as an NISC in the form of a thumb-drive, the system-level controller is the software running on a computing device that communicates with the thumb-drive. In various embodiments of the invention, software applications can be used to analyze the data provided by the NISC detector. In yet another embodiment, the system-level controller can be an RFID tag.

Applications/Operational Objectives

Detect Contraband

Passive Detection (e.g., Works on Materials that Give Off Neutrons, e.g., SNM)

In one exemplary embodiment of the NISC detector technology, Illicit Trafficking Radiation Assessment Program ("ITRAP") portal monitoring specifications require that a system be able to detect a 20000 neutron/sec source from a distance of 2*m* with a 10 second exposure while giving only a 1% gamma ray false alarm. A 10×10×2 NISC array meets both of these sensitivity and throughput requirements.

Cargo Container/Transportation Portal

Figure 31A:
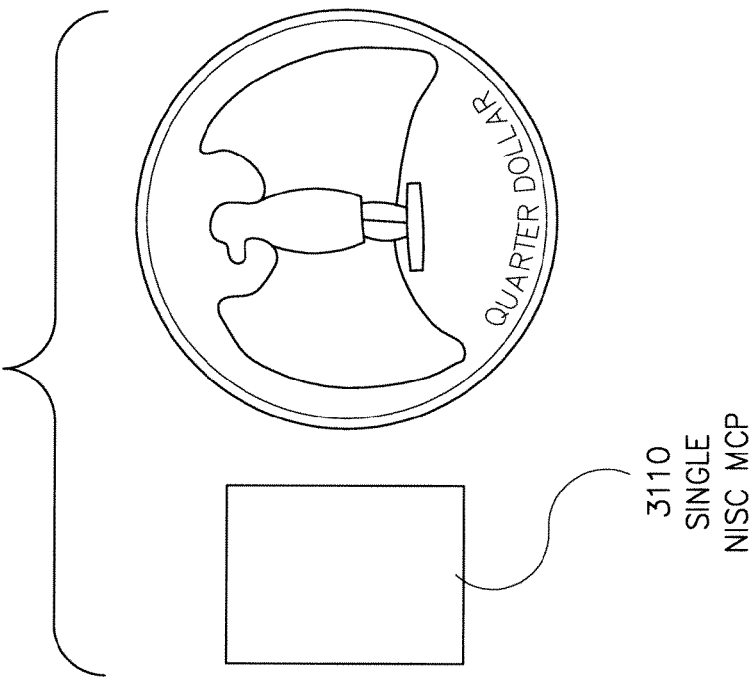
FIG. 31A shows the scale of a single multi-chip package in accordance with an exemplary embodiment.

For example, the NISC detectors could be used at a transportation port where people, cargo, ships, trucks, trains or aircraft enter. As illustrated in FIG. 30, an exemplary detector 3010 can comprise an MCP 3030 mounted on a circuit board 3015, a battery 3035, a polyethylene moderator 3025 for slowing neutrons, a ceramic housing 3020 to protect the detector, and a semi-passive RFID tag 3040 for transmitting readings from the detector. The size of an exemplary NISC MCP 3110 is illustrated in FIG. 31A. Detection of an ITRAP shielded source (20*k* neutrons/sec.) at 1-1.5 days exposure is capable with a single MCP NISC array. A 20' container (TFE) can be covered by 1-2 (2"×4") units. The units can be read by semi-passive RFID readers mounted on IMF gantry cranes, grappler lifters, and reach stackers. A single MCP NISC device can be used for most air freight containers or pallets. Additional readers can be integrated into rail/truck portal monitors. A similar detector can be placed on intermodal rail cars and integrated with existing RFID systems.

Containers typically sit in staging areas for significantly longer time than for portal egress. A NISC sensor grid placed in the staging area, e.g., in the ground/floor can benefit from longer acquisition times. Such sensor deployment adds another point of pervasive monitoring not practical with $^3$He tube-based detectors. This approach can be an interim solution prior to complete deployment at portals.

Long Range Detection, Long Range/Remote Scanning

As illustrated in FIG. 31B, large arrays of NISC detectors can be placed at or near the point of entry to a port, e.g., the underside of bridges, navigation buoys, mounted on ship docks and container cranes. Such arrays would scan passing or docked vessels for special nuclear material ("SNM"). Some embodiments of the technology can detect ITRAP sources at 70 m (e.g., clearance of the Verrazano-Narrows Bridge) with ninety (90) second dwell times. A 16×0.3 m×0.3 m array with a 2.5 m collimator for background suppression can provide an 80-100 m range for ITRAP source detection.

Neutron Interrogation

Neutron interrogation ("NI"), or active detection, involves directing a neutron source at an object so that it emits neutrons and so that readings of the emitted neutrons can be taken with a detector. Neutron interrogation can be used to extend the effective range of neutron-based detection using NISC and for detecting Highly-Enriched Uranium (HEU). HEU is harder to detect than Pu due to a very low spontaneous fission rate. Neutron interrogation uses a pulsed neutron generator (preferably portable) to irradiate special nuclear material, causing the generation of fission-induced prompt and delayed neutrons and gamma rays.

Neutron detection is preferable over gamma ray detection in the NI application since neutron detection is more discriminatory to SNM. NISC is gamma insensitive, and scalable to large arrays for increased range, reduced neutron dose, and better SNM discrimination.

Protect Personnel

First Responder

Typical first responder radiation detectors are gamma-sensitive only (BNC nukeAlert is an exception). $^3$HE proportional counters are not suitable for first responder applications for at least several reasons: high power requirements, low efficiency for small tube sizes, use of a LiI(Er) (Lithium Iodide doped with Erbium) scintillator.

NISC technology presents advantages for first responder applications including small size, low power, high neutron sensitivity, no gamma sensitivity, self-contained IC electronics, and ease of integration into existing systems.

Individual, e.g., Soldier

In addition to high sensitivity, size and power consumption are critical for any personnel application—both the detector and any power source have to be carried. The high sensitivity and small size of the NISC is very advantageous for these applications. Even small arrays can be fit into shirt pocket packages. NISC continues to operate without electrical power and requires only very little power to be read. For example, RFID read technology could be used to read a NISC detector. NISC detectors could be packaged in a variety of configurations, including (i) a chip with a controller worn on the wrist; (ii) a handheld device; or (iii) a dosimetry badge.

Radon Detection

Radon is a noble gas product from the decay of uranium and thorium and decays by alpha emission. Radon decays into polonium and lead, both of which are radioactive. Because radon decays by emission of alpha particles at approximately 5.5 MeV, there is no requirement for boron in the NISC detector. Instead the alpha particles will directly affect the charges stored in the charge trapping layer. The 5.5 Mev alpha particles can travel approximately 4 cm and will require about 1.6 MeV to penetrate the upper layers of the film before reaching the array of memory cells in the chip. While a neutron array could typically include 2400 die, 2 die are sufficient for a radon detector. MCPs and stacking of chips will be ineffective in detecting radon because the alpha particles lack sufficient energy to penetrate multiple levels of chips. In the preferred embodiment of the radon detector, it is also preferable to minimize $^{10}$B because you do not want the chip to interact significantly with background neutrons.

Diagnostic

Neutron Source Imaging—Medical

Because each NISC chip is a collection of smaller charge storage nodes that serve as detectors, the NISC chips can be used for imaging and spatial resolution. For example, each charge storage node can be used in a manner similar to a pixel in a display. When implemented with a neutron interrogator, NISC detectors can be used similar to an X-ray to provide images of features internal to the body. Also, neutrons are sensitive to certain isotopes creating opportunities to use those isotopes as a tracer in medical imaging. The imaging could be performed in 2-D slices to be assembled into 3-D images.

Imaging—Geological and Archeological

Neutron detection technology can also be used for imaging geologic formations. Whereas X-rays are not powerful enough to be used in geological applications, neutrons typically have sufficient energy to penetrate rock creating opportunities to use NISC detector technology for imaging in geological and archeological applications.

Context of the Deployment
Clandestine

NISC detectors are indistinguishable from flash memory MCPs, which are standard components in many electronic devices. Therefore, NISC detectors can be deployed in small electronic devices and used for nuclear monitoring and interdiction.

The single-MCP NISC detector can be concealed in any number of everyday objects. Multiple NISC detectors can be concealed in an ordinary rock of native geology and scattered across a suspected site or transportation route. NISC detectors can also be deployed in various configurations, such as arrays or back-to-back, to provide directional information.

Underwater

NISC detectors, and arrays thereof, can also be incorporated into underwater detectors and vehicles that can pass beneath suspect vessels. For example, the NISC detectors can scan for SNM through the hull of vessels approaching a port or canal.

CONCLUSION

The embodiments set forth herein are intended to be exemplary. From the description of the exemplary embodiments, equivalents of the elements shown herein and ways of constructing other embodiments of the invention will be apparent to practitioners of the art. Many other modifications, features and embodiments of the invention will become evident to those of skill in the art. It should be appreciated, therefore, that many aspects of the invention were described above by way of example only and are not intended as required or essential elements of the invention unless explicitly stated otherwise. Accordingly, it should be understood that the foregoing relates only to certain embodiments of the invention and that numerous changes can be made therein without departing from the spirit and scope of the invention.

We claim:

1. A device for detecting neutrons comprising:
a charge storage structure, the charge storage structure comprising,
a first layer comprising boron-10 that reacts with a neutron producing an alpha particle and a lithium ion;
a second layer located below the first layer and comprising silicon;
a third layer located below the second layer and comprising a dielectric;
a fourth layer located below the third layer, the fourth layer comprising a non-conductive material and a plurality of electrons giving the fourth layer a net negative charge;
a fifth layer located below the fourth layer and comprising a dielectric; and
a sixth layer located below the fifth layer and comprising silicon.

2. The device of claim 1, wherein the plurality of electrons in the fourth layer are stored as a first group on a first side of the fourth layer and a second group on a second side of the fourth layer.

3. The device of claim 1, comprising a plurality of charge storage structures comprising an array capable of creating an image from detected neutrons.

4. The device of claim 1, wherein the first layer is within 0.85 micrometers of the fourth layer.

5. The device of claim 1, wherein there is a first electric field between the fourth layer and the second layer.

6. The device of claim 1, wherein there is a second electric field between the fourth layer and the sixth layer.

7. The device of claim 1, wherein the first layer has been enriched with boron-10.

8. The device of claim 1, wherein the net negative charge of the fourth layer changes in response to one of the alpha particle and the lithium ion.

9. A device for detecting a particle emitted from radioactive material comprising:
a charge storage structure, the charge storage structure comprising,
a first layer comprising a reactive material that reacts with the particle and produces at least one ion;
a second layer located below the first layer and comprising silicon;
a third layer located below the second layer and comprising a non-conductive material;
a fourth layer located below the third layer, the fourth layer comprising a non-conductive material and a plurality of electrons giving the fourth layer a net negative charge;
a fifth layer located below the fourth layer and comprising a non-conductive material; and
a sixth layer located below the fifth layer and comprising silicon.

10. The device of claim 9, wherein the plurality of electrons in the fourth layer are stored as a first group on a first side of the fourth layer and a second group on a second side of the fourth layer.

11. The device of claim 9, comprising a plurality of charge storage structures comprising an array capable of creating an image from detected particles.

12. The device of claim 9, wherein there is a first electric field between the fourth layer and the second layer.

13. The device of claim 9, wherein there is a second electric field between the fourth layer and the sixth layer.

14. The device of claim 9, wherein the first layer is within 0.85 micrometers of the fourth layer.

15. The device of claim 9, wherein the net negative charge of the fourth layer changes in response to the ion.

* * * * *

UNITED STATES PATENT AND TRADEMARK OFFICE
CERTIFICATE OF CORRECTION

PATENT NO. : 8,436,289 B1
APPLICATION NO. : 12/844888
DATED : May 7, 2013
INVENTOR(S) : Hossain et al.

It is certified that error appears in the above-identified patent and that said Letters Patent is hereby corrected as shown below:

On the Title Page Item [60]:
"provisional application No. 60/060,001" should read --provisional application No. 61/060,001--.

In the Specifications:
Column 23, line 34, "SiO2" should read --$SiO_2$--.

Signed and Sealed this
Second Day of July, 2013

Teresa Stanek Rea
*Acting Director of the United States Patent and Trademark Office*